United States Patent
Jonsson et al.

(10) Patent No.: US 8,253,610 B2
(45) Date of Patent: Aug. 28, 2012

(54) SYSTEMS AND METHODS FOR VARIABLE RATE CONVERSION

(75) Inventors: Ragnar H Jonsson, Laguna Niguel, CA (US); Vilhjalmur S Thorvaldsson, Irvine, CA (US); Trausti Thormundsson, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 12/932,170

(22) Filed: Feb. 17, 2011

(65) Prior Publication Data

US 2011/0254711 A1    Oct. 20, 2011

Related U.S. Application Data

(63) Continuation of application No. 12/488,322, filed on Jun. 19, 2009, now Pat. No. 7,920,078.

(51) Int. Cl.
*H03M 7/00* (2006.01)

(52) U.S. Cl. .......................................... 341/61; 708/313

(58) Field of Classification Search ................... 341/61; 708/313, 322; 710/57
See application file for complete search history.

(56) References Cited

U.S. PATENT DOCUMENTS

| | | | | |
|---|---|---|---|---|
| 4,954,824 A | * | 9/1990 | Yamada et al. | 341/61 |
| 5,274,372 A | * | 12/1993 | Luthra et al. | 341/61 |
| 7,167,112 B2 | * | 1/2007 | Andersen et al. | 341/61 |
| 2002/0140853 A1 | * | 10/2002 | Yang et al. | 348/441 |
| 2009/0319065 A1 | * | 12/2009 | Risbo | 700/94 |

* cited by examiner

*Primary Examiner* — Howard Williams
(74) *Attorney, Agent, or Firm* — Farjami & Farjami LLP

(57) ABSTRACT

Poly-phase filters are used to offer an efficient and low complexity solution to rate conversion. However, they suffer from inflexibility and are not easily reconfigured. A novel design for rate converters employ poly-phase filters but utilize interpolation between filter coefficients to add flexibility to rate conversion. This interpolation can be implemented as an interpolation of the poly-phase filter results. Additional approximations can be made to further reduce the amount of calculations required to implement a flexible rate converter.

12 Claims, 27 Drawing Sheets

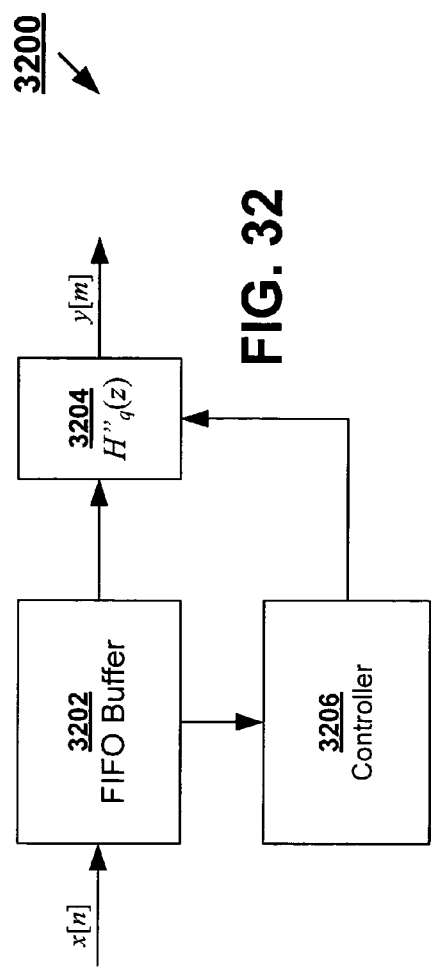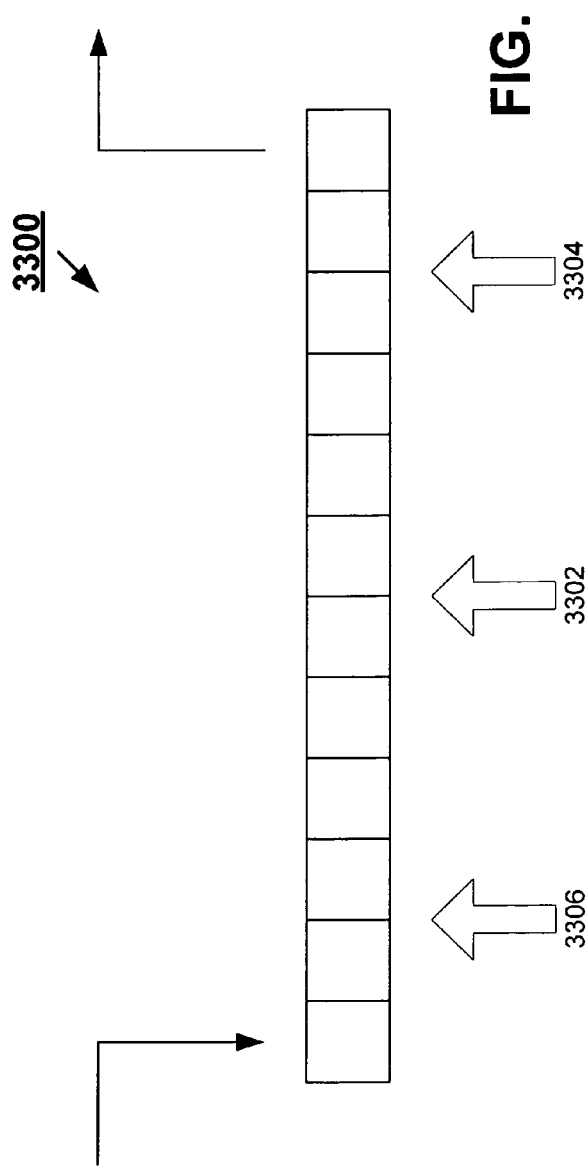

SYSTEMS AND METHODS FOR VARIABLE RATE CONVERSION

The present application is a continuation of U.S. application Ser. No. 12/488,322, filed Jun. 19, 2009, now U.S. Pat. No. 7,920,078.

BACKGROUND OF THE INVENTION

1. Field of the Invention

The present invention relates generally to rate conversion of digital data and specifically with the use of poly-phase filters for rate conversion.

2. Related Art

Data is often manifested as discrete time data, that is a representative sample is presented at a given rate. Digital data goes further and each sample is quantized to a digital value. While some data is derived purely digitally, such as the results from a computation by the process, other data is associated with an original analog form, such as audio or video. The analog signal is sampled at the given rate to convert it to a discrete time or digital data. This rate is known as the sampling rate. For example, in audio applications, 44.1 kHz and 48 kHz are common sampling rates.

The process of converting between two sampling rates is known as rate conversion. If the rate conversion goes from a lower rate to a higher rate, it is referred to as upsampling or interpolation. If the rate conversion goes from a higher rate to a lower rate, it is referred to as downsampling or decimation.

FIG. 1 illustrates a typical rate conversion system using a traditional rate converter for a rational rate conversion. In this example, the output is sampled at a rate of L/M times the input sampling rate. The input is signal is first upsampled to the least common multiple of the input and output sampling rate by upsampler 102. Upsampler 102 typically inserts zeroes between the input samples to increase the sampling rate in a process known as zero-padding. This converts the input signal to an upsampled signal at L times the sampling rate. The upsampled signal is then filtered using filter 104 which is a usually a low pass filter. The filter smoothes out the upsampled signal and also prevents aliasing from the downsampling process which is performed by downsampler 106. Typically, downsampler 106 uses decimation to convert from the higher intermediate rate to the lower output rate. The result is a signal that has been downsampled by a factor of M or a total rate change by a factor of L/M.

FIGS. 2A-2D illustrate an example of a rate conversion by 3/2. Graph 202 shows an input signal at a sampling rate that is 2f, where f represents a common sampling rate. Since this example merely expresses sampling rates with a relative rate conversion of 3/2 the specific value of f is not important. Graph 204 the signal is upsampled to 6f by zero-padding. This might be performed by upsampler 102 of system 100. Graph 206 shows the signal after being filtered possibly by a filter like filter 104. Graph 208 shows the signal after resampling or downconversion by a downsampler such as downsampler 106. This is done by decimation. It can be seen that for this 2-1 downconversion, every other 6f sample is discarded to obtain a 3f signal.

One difficulty with this approach is that it relies on finding a reasonable least common multiple. In the case of going from 2f to 3f, a least common multiple of 6f is used. However, in many situations, the least common multiple is not so small. For example to rate convert between to common audio sampling rates 44.1 kHz used by conventional CD and 48 kHz used by other digital audio standards including DVDs, the least common multiple is 7.056 MHz. Rate conversion from 44.1 kHz and 48 kHz would require a 160/147 rate conversion. One key challenge is that the low pass filter would have to operate at 7.056 Mhz which is more than 100 times the sampling rate either input or output operate at. Furthermore, the bandwidth of the filter should be the minimum of the two rates 44.1 kHz and 48 kHz, and the digital filter would typically require 5000-10000 filter coefficients.

One approach to simplify and reduce the demands on resources is to use poly-phase filters. To demonstrate how poly-phase filters can be used, the rate conversion example of FIGS. 2A-2D is used. Suppose a finite impulse response (FIR) filter with an impulse response length of 6 which has 6 filter coefficients is used. It should be noted that in this example, 6 filter coefficients are used for simplicity, but in practice many more coefficients are usually required. Mathematically, this can be summed up as $$y'[n] = \sum_{k=0}^{5} h[k]x'[n-k], \quad (1)$$

where x'[n] is the input signal upsampled to 6f and y'[n] is the filtered signal before downconversion.

FIG. 3 illustrates a conventional FIR filter for implementing equation (1). The input x'[n] is fed through a delay line shown by delay elements 302, 304, 306, 308 and 310. The filter coefficients are applied by scaling elements 312, 314, 316, 318, 320, and 322. The results are summed up by adders 332, 334, 336, 338, and 340. One of ordinary skill in the art will understand that there are many optimizations and equivalent structures. The difficulty in this particular design in a rate converter not only is in the size of the filter, but the delay lines, scaling elements, and adders must operate at the high common multiple sampling rate. While in the given example, the components only operate at a threefold rate, which may not be considered a serious obstacle, in some practical conversion ratios, such the 44.1 kHz to 48 kHz conversion, where an increase in performance of components of over two order of magnitude would be required. This could drastically increase the cost of the components.

To further observe how to derive a poly-phase filter implementation of a rate converter. The first few terms of equation (1), are expanded and can be expressed by equations in (2).

$y'[0]=x'[0]h[0]+x'[-1]h[1]+x'[-2]h[2]+x'[-3]h[3]+x'[-4]h[4]+x'[-5]h[5]$ $y'[1]=x'[1]h[0]+x'[0]h[1]+x'[-1]h[2]+x'[-2]h[3]+x'[-3]h[4]+x'[-4]h[5]$ $y'[2]=x'[2]h[0]+x'[1]h[1]+x'[0]h[2]+x'[-1]h[3]+x'[-2]h[4]+x'[-3]h[5]$ $y'[3]=x'[3]h[0]+x'[2]h[1]+x'[1]h[2]+x'[0]h[3]+x'[-1]h[4]+x'[-2]h[5]$ $y'[4]=x'[4]h[0]+x'[3]h[1]+x'[2]h[2]+x'[1]h[3]+x'[0]h[4]+x'[-1]h[5]$ $y'[5]=x'[5]h[0]+x'[4]h[1]+x'[3]h[2]+x'[2]h[3]+x'[1]h[4]+x'[0]h[5]. \quad (2)$ As noted above x'[i] is derived from zero padding x[j], which can be expressed by equation (3).

$$x'[n] = \begin{cases} x\left[\dfrac{n}{3}\right], & \text{if } n \text{ is divisible by 3} \\ 0, & \text{otherwise} \end{cases} \quad (3)$$

Because of the zero padding in equation (3) it should be noted that all x'[n] terms in (2) are zero except for x'[−3], x'[0] and x'[3]. By substituting equation (3) into (2) results in the following simplified series of equations:

$$y'[0]=x'[0]h[0]+x'[-3]h[3]=x[0]h[0]+x[-1]h[3]$$

$$y'[1]=x'[0]h[1]+x'[-3]h[4]=x[0]h[1]+x[-1]h[4]$$

$$y'[2]=x'[0]h[2]+x'[-3]h[5]=x[0]h[2]+x[-1]h[5]$$

$$y'[3]=x'[3]h[0]+x'[0]h[3]=x[1]h[0]+x[0]h[3]$$

$$y'[4]=x'[3]h[1]+x'[0]h[4]=x[1]h[1]+x[0]h[4]$$

$$y'[5]=x'[3]h[2]+x'[0]h[5]=x[1]h[2]+x[0]h[5]. \quad (4)$$

Because the final output downsamples y' into y, the decimation process can be expressed simply as:

$$y[n]=y'[2n]. \quad (5)$$

This reduces equations in (4) into the following series of equations:

$$y[0]=y'[0]=x[0]h[0]+x[-1]h[3]$$

$$y[1]=y'[2]=x[0]h[2]+x[-1]h[5]$$

$$y[2]=y'[4]=x[1]h[1]+x[0]h[4]. \quad (6)$$

Comparing the equations for a general filter in (2) and the final simplified equations in (6), it can be seen that the number of calculations and complexity can be greatly reduced. FIG. 4 shows a corresponding poly-phase architecture. Rate converter 400 comprises delay line 402 which now operates at the input sampling rate 2f. Scaling elements 404 and 406 as well as adder 408 operate at the output sampling rate 3f. Scaling elements 404 and 406 apply the filter coefficient similarly to the scaling elements in FIG. 3 except the filter coefficients change. Hence the coefficients are presented by $h_i[n]$ rather than simply h[n], where the index i changes with the index of the output sample at output sampling rate 3f. In the specific example given above, $h_i[1]$ cycles through the coefficients h[3], h[5], and h[4], and $h_i[0]$ cycles through the coefficients h[0], h[2], and h[1]. The poly-phase architecture has many advantages in that fewer operations take place and the components can operate at a lower sampling rate.

FIG. 5 shows a generalized poly-phase architecture for rate conversion. Rate converter 500 comprises a delay line having a plurality of delay elements shown by representative delay elements 502, 504, and 506, which operate at the input sampling rate. A plurality of scaling elements shown by representative scaling elements 512, 514, 516 and 518 apply filter coefficients $h_i[n]$ where the index i changes at the output sampling rate. The results are summed together either by one or more adders shown here by adders 522, 524 and 526. In this example only representative stages are shown, but it should be understood that this and subsequent diagrams are intended to illustrate a generalized N-stage architecture.

One difficulty with the traditional use of poly-phase filters is that the design relics on a fixed input and output sampling rate. It is not suitable for changing rates. Furthermore, it still relies on a rational relationship between the input and output sampling rates. In the case of an incommensurate ratio between sampling rates, the traditional poly-phase rate converter cannot be applied.

FIG. 6 shows the use of a Farrow architecture for handling incommensurate ratios. The input signal is buffered by input module 602 which serves as a buffer to hold the input to the next integer cycle of the output sample rate. It also calculates the fractional delay of the output sample, this fractional delay is shown as d. The buffered input is passed through a plurality of linear filters represented by filters 612, 614, 616, 618, and 620, at each stage a running sum is calculated where each previous stage is multiplied by the fractional delay. The multiplication are shown in this example as performed by scaling elements 628, 626, 624 and 622. The running sums are shown here as performed by 632, 634, 636 and 638. Essentially, this structure evaluates a polynomial in the fractional difference, where the polynomial coefficients are actually linear filters. The primary difficulty in this approach is that it has high computational load and it is inflexible because the filter coefficients for all the filters must be calculated offline beforehand. In particular, it does not allow flexibility in tradeoff between complexity and quality once the filter coefficients have been designed.

Therefore, there is a need in the industry for a flexible rate converter that is computational efficient.

SUMMARY OF INVENTION

A poly-phase filter structure can be used for flexible rate conversion. The poly-phase filter coefficients change depending on the phase index of the filter. The number of phases and filter coefficients are based on the nominal input sampling rate and the output sampling rate. The rate converter to receive an input at a sampling rate which is different than the nominal input sampling rate of the poly-phase filter structure. The result is that each input sample corresponds to a phase offset rather than a phase index. Since the filter coefficients correspond to sampling a filter transfer function, a phase offset between two integer indices can be interpolated. Due to the linearity of the summations in the poly-phase filter coefficients, the interpolation can be viewed as interpolating the results of the poly-phase filter at the nearby phase indices. For example, the nearest two indicies are used for linear interpolation and the nearest four phase indices for cubic interpolation. Alternatively, a flexible rate converter can comprise a plurality of poly-phase subfilters. The interpolation can be performed on each poly-phase subfilter independently and the resultant values can be summed together to produce an output.

An alternative to straight interpolation is to skip the interpolation when the fractional part, that is the difference between the phase offset and the largest phase index less than the phase offset, is near zero. A small fraction approximator can be used which uses the result of the poly-phase filter (or subfilter) at the phase index if the fractional part is near zero. A small fraction approximator can be used which uses the result of the poly-phase filter (or subfilter) at the smallest phase index greater than the phase offset instead of the interpolation, if the fractional part is near one.

The flexible rate converter can be used to further synchronize an unknown input sampling rate near the nominal input sampling rate by monitoring a first-in-first-out (FIFO) memory coupled to the rate converter's input and adjusting the input sampling rate based on whether the FIFO is filling up or emptying. Similarly the flexible rate converter can be used to further synchronize an unknown output sampling rate by monitoring a FIFO memory coupled to the rate converter's output and adjusting the output sampling rate based on whether the FIFO is filling up or emptying.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 32 illustrates a system for rate conversion which can determine the input sampling rate;

FIG. 33 is a diagram of a FIFO used in an embodiment of the rate conversion system depicted in FIG. 32;

and

Figure 35:
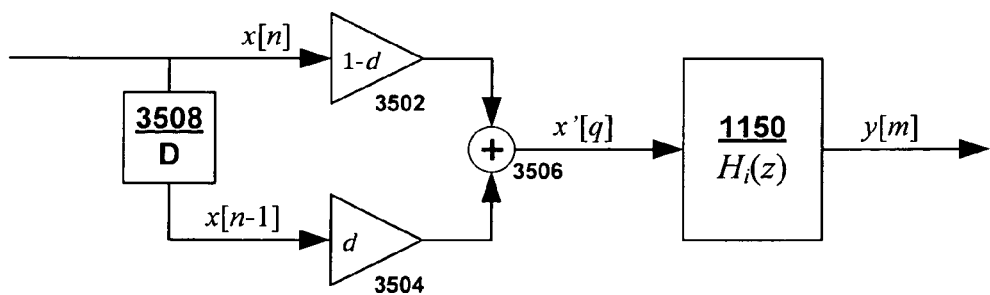

FIG. 35 shows a variable rate conversion system using linear interpolation of the input signal.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

In a rate converter the discrete low pass filter should have a bandwidth 1/R where R is typically the larger of the upsampling factor L and downsampling factor M. One implementation of the low pass filter has an impulse response of $$h[n] = W[n] \cdot sinc\left(\frac{n}{R}\right),$$

where W[n] is a impulse response of a window function. When this is split into poly-phase filter components $$h_m[k] = h[L \cdot k + m] = W[L \cdot k + m] = sinc\left(\frac{L}{R}n + \frac{m}{R}\right), \quad (7)$$

where m is an index based on the output samples and k is an index based on the input samples. Furthermore, the arithmetic inside the brackets of h[ ] and W[ ] is performed modulo M.

Figure 1:
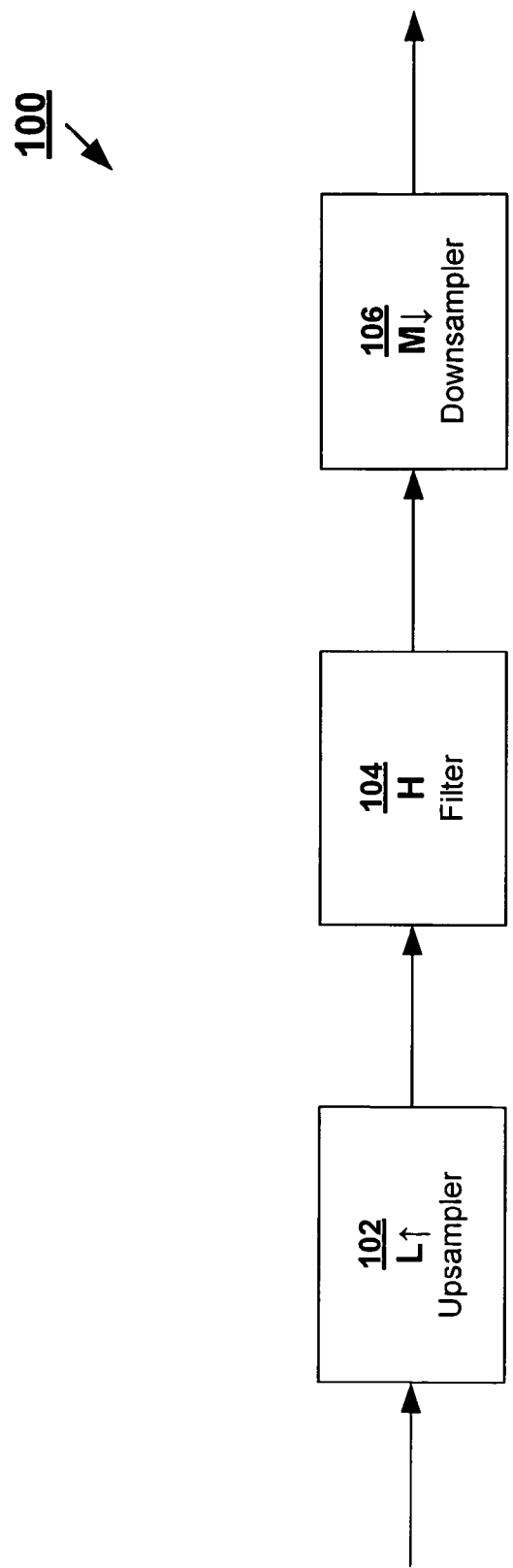
FIG. 1 illustrates a typical rate conversion system using a traditional rate converter for a rational rate conversion.
Figure 2A:
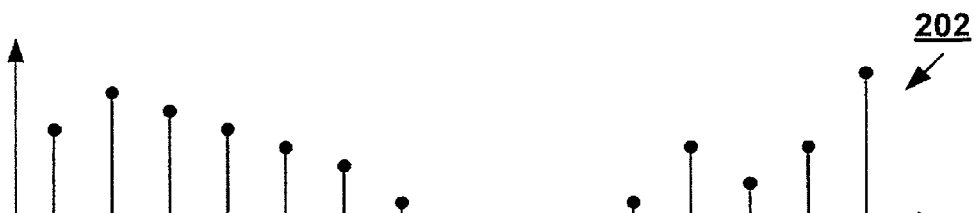
FIGS. 2A-2D illustrate an example of a rate conversion by 3/2.
Figure 2B:
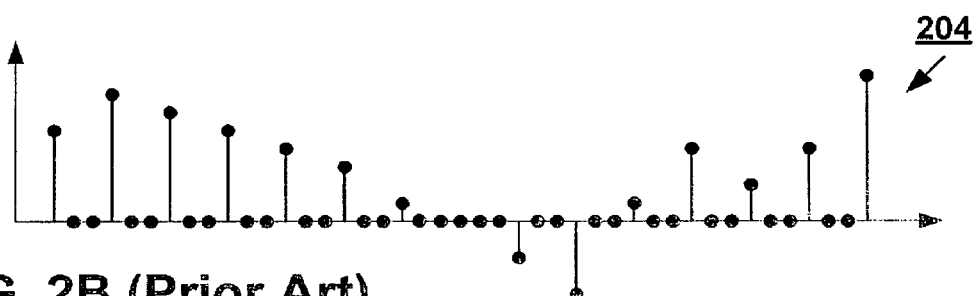
Figure 2C:
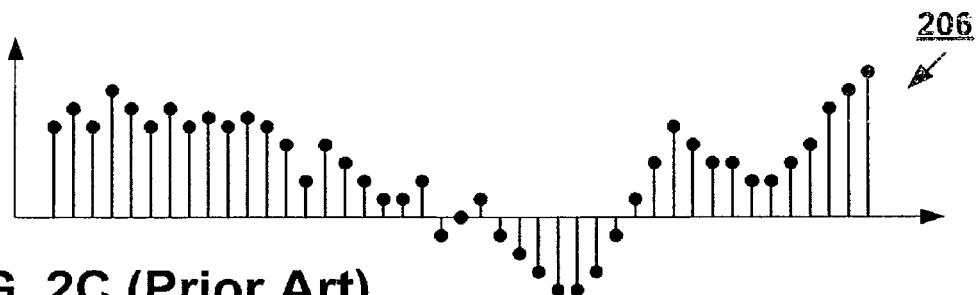
Figure 2D:
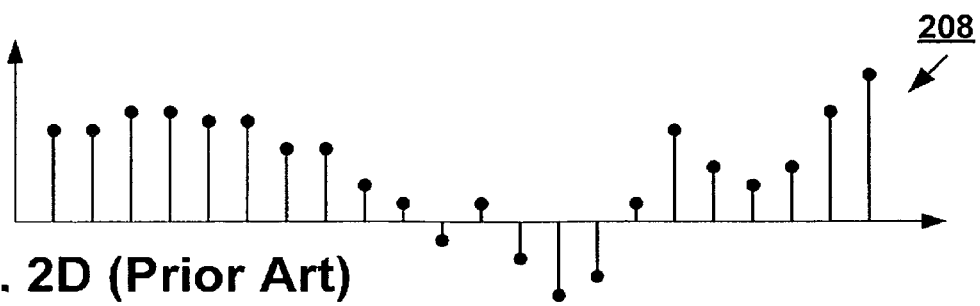
Figure 3:
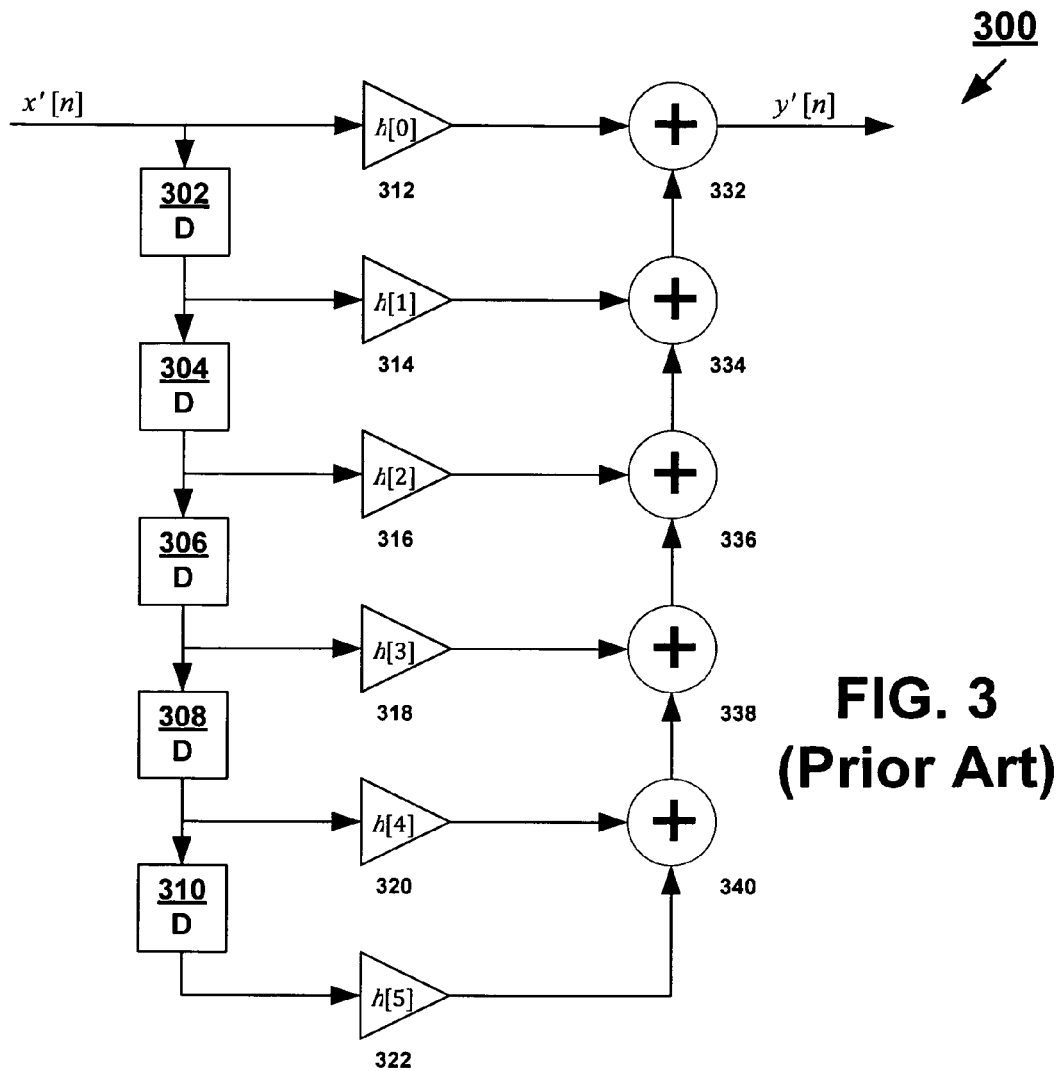
FIG. 3 illustrates a conventional FIR filter for implementing equation (1)
Figure 4:
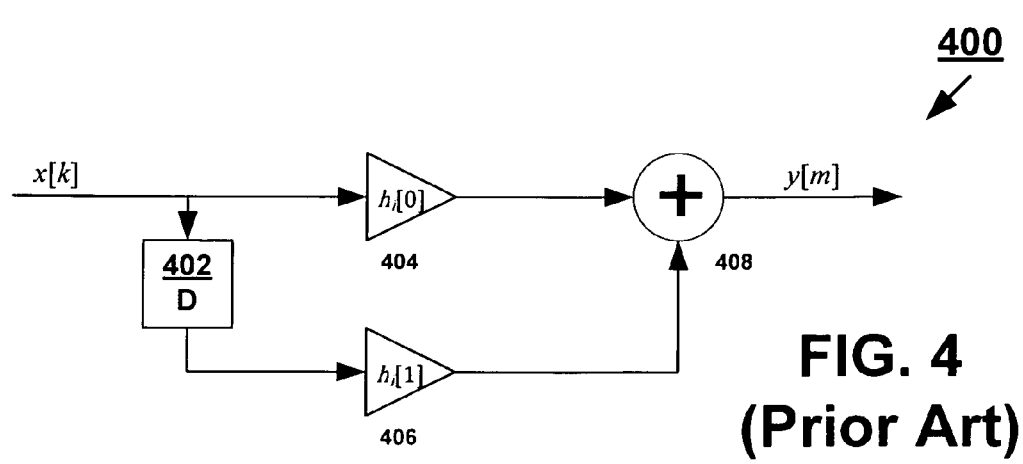
FIG. 4 shows a corresponding poly-phase architecture to the FIR filter of FIG. 3.
Figure 5:
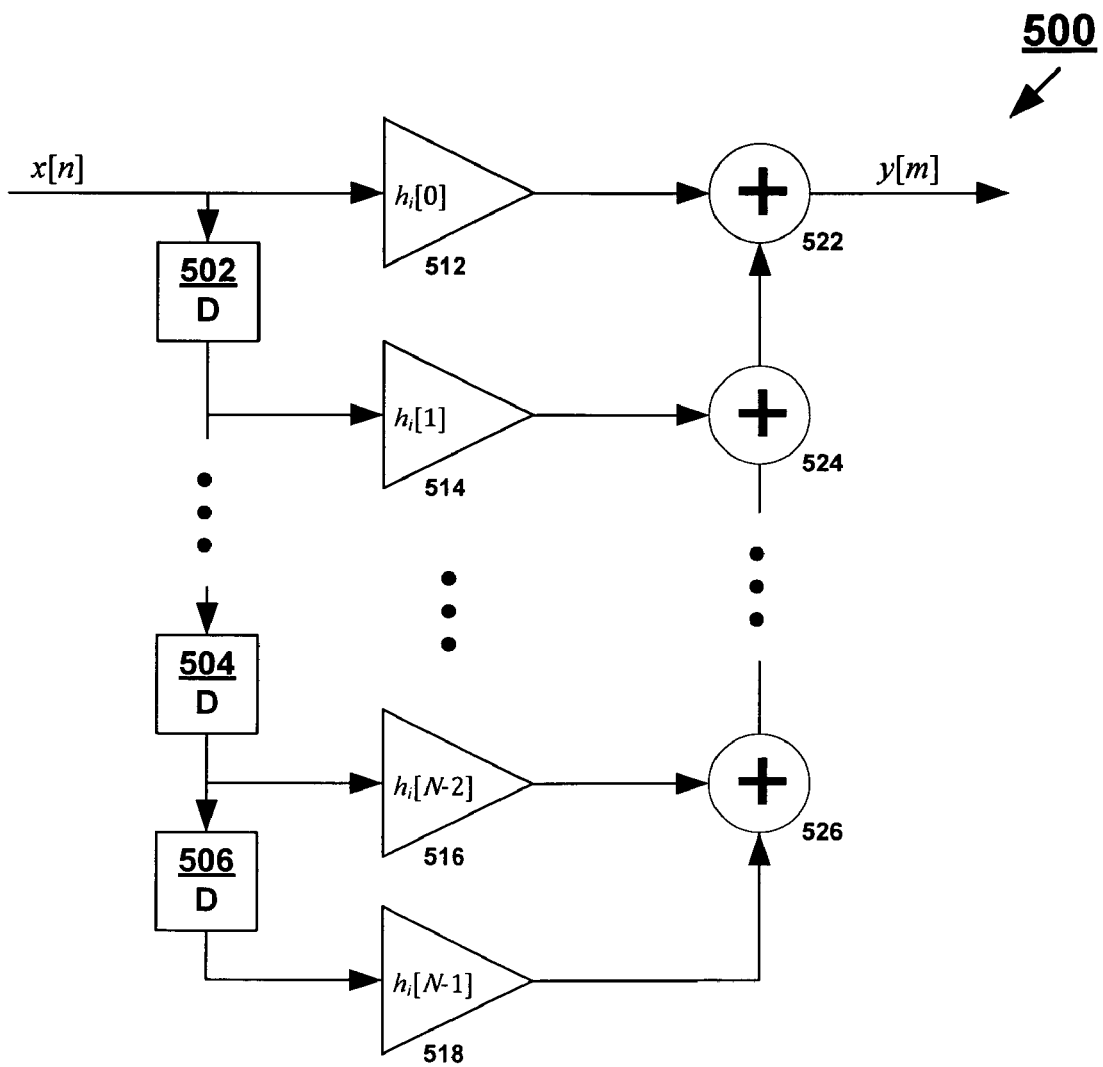
FIG. 5 shows a generalized poly-phase architecture for rate conversion.
Figure 6:
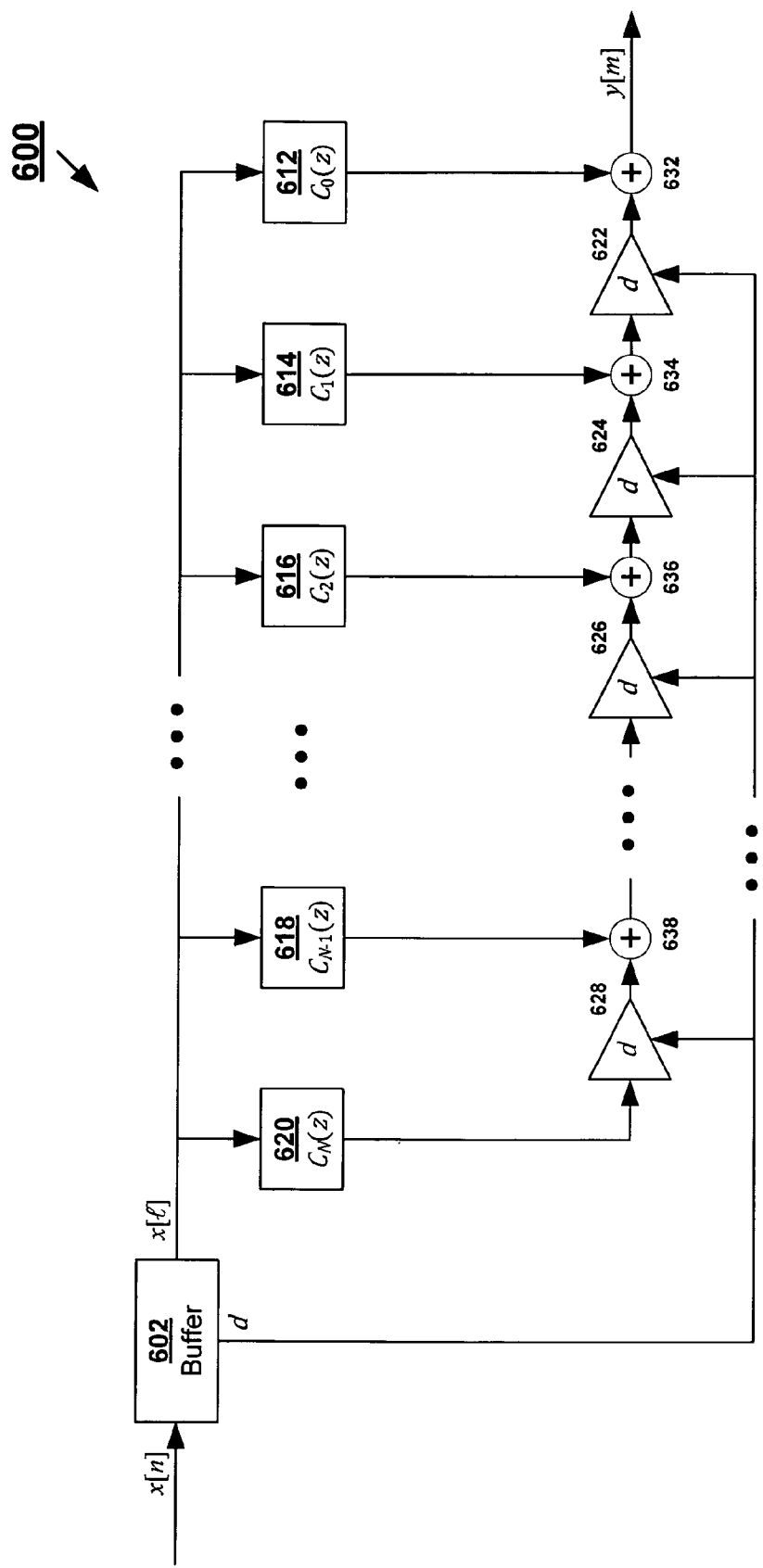
FIG. 6 shows the use of a Farrow architecture for handling incommensurate ratios.

The standard rate converter shown in FIG. 5 and with the specific example in FIG. 4 is not flexible. They are designed for a specific input sampling rate and a specific output sampling rate. Embodiments of the present invention employ poly-phase design similar to the rate converter 500, but extend the architecture to a more generalized input rate. Returning to the simplified example of FIG. 4, suppose rather than the rate conversion from an input sampling rate 2f to an output sampling rate of 3f, an input sampling rate of 2.2f is desired. For the sake of nomenclature, the input sampling rate for which the poly-phase filter was originally designed is referred to as the nominal input sampling rate.

If the input sampling rate of rate converter 400 is changed from the nominal input sampling rate of 2f to an input sampling rate of 2.2f, delay line 402 would operate at 2.2f, but the poly-phase filter coefficients would not work since the input signal is out of phase with the nominal input sampling rate. However, equation (7), the poly-phase filter coefficients are essentially sampling the impulse response of a filter. By the same token, filter coefficients could be derived for other sampling rates. The difficulty in using this equation is that either a lot of values need to be precalculated or they need to be computed on the fly. The former alternative could require a lot of storage especially if the input and output sampling rates are incommensurate or have a very large least common multiple and the latter alternative could require a lot of computational capability.

Figure 7:
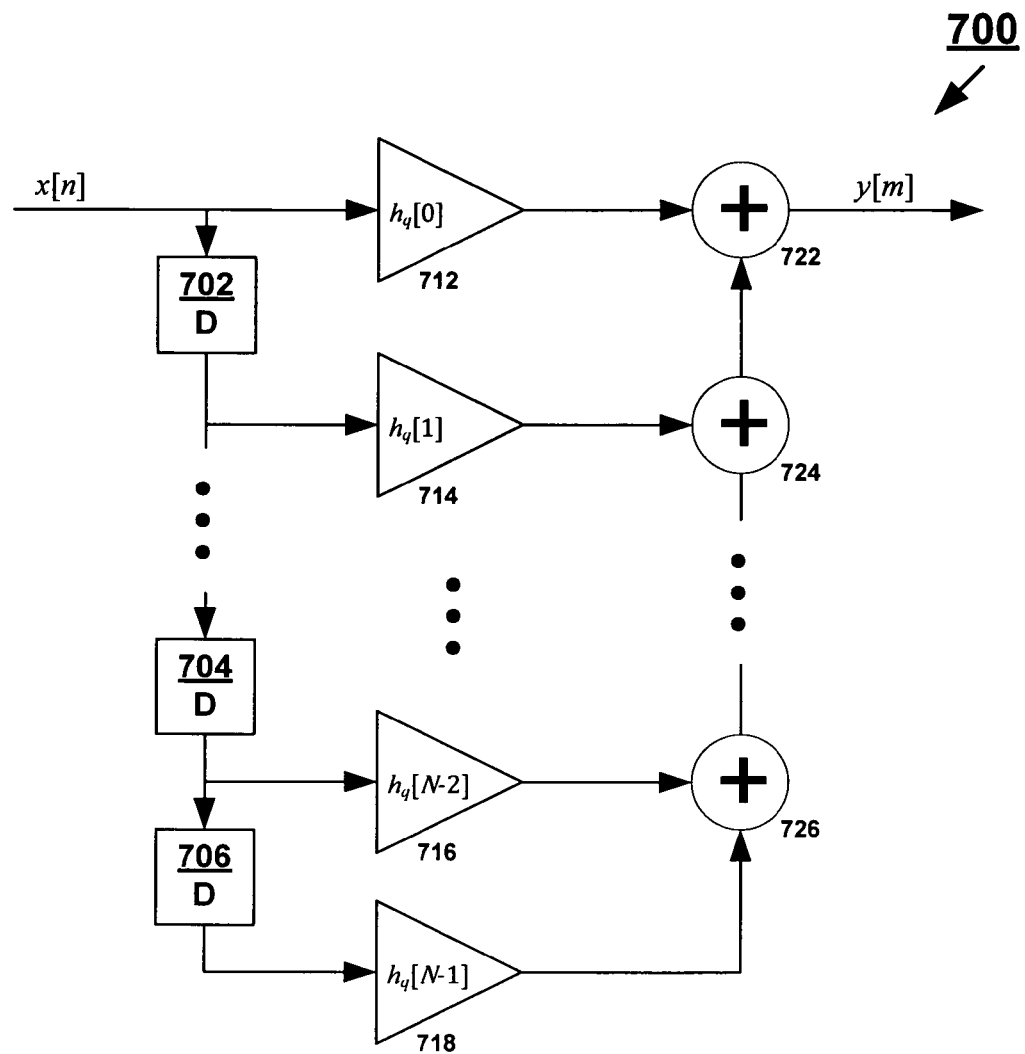
FIG. 7 shows a generalized poly-phase architecture for arbitrary rate conversion.

FIG. 7 shows a generalize poly-phase architecture for arbitrary rate conversion. Rate converter 700 comprises a plurality of delay units configured in a delay line, presented by delay units 702, 704, and 706, operating at the input sampling rate, a plurality of scaling elements that change with the output sampling rate, and one or more adders, represented here by adders 722, 724, and 726. Unlike the filter coefficients apply by scaling elements 512, 514, 516 and 518, the plurality of scaling elements represented by scaling elements 712, 714, 716, and 718, apply filter coefficients $h_q[k]$ which are not indexed by an integer value i, but by an "index" that on any real value q. For convenience, this real "index" is referred to as a phase offset as opposed to the integer value which is referred to as a phase index. While in general the $h_q[k]$ can be calculated on the fly or precalculated from equation (7). This is not computationally or storage efficient. Instead, the filter coefficients $h_i[k]$ are calculated in the same fashion as for rate converter 500 at the nominal input sampling rate. The key difference between rate converter 500 and rate converter 700 is that the input sampling rate and the nominal input sampling rate are different for rate converter 700, while they are the same for converter 500.

With regard to a poly-phase rate converter, by design there is an nominal input sampling rate which is upsampled to an intermediate high sampling rate which a common multiple of the nominal input sampling rate and the output sampling rate. The least common multiple is typically chosen. Implicit in the poly-phase rate converter there is an upsampling factor from the nominal input sampling rate to the intermediate high sampling rate and a downsampling factor from the intermediate high sampling rate and the output sampling rate. In a traditional FIR filter many components would require operating at the intermediate high rate, but the poly-phase implementation eliminates the actual need however in the derivation, there is an implicit upsampling to the intermediate high sampling rate back down to the output sampling rate. In a typical poly-phase filter the upsampling factor is equal to the number of phases. When an input sampling rate different than the nominal input sampling rate is used, there is an implicit upsampling factor from the input sampling rate to the intermediate high sampling rate but it is not tied to the number of phases.

Mathematically, a given poly-phase structure the nominal input sampling rate, the output sampling rate and the intermediate high sampling rate are relative. Because of this by changing the rate at which the components operate, the output sampling rate can be adjusted. If the output sampling rate is adjusted the intermediate high sampling rate and the nominal sampling rate are changed. For example, given the rate converter in FIG. 4, if the output sampling rate is changed to 2.7f, then the intermediate high frequency would be 5.4f and the nominal input sampling rate would be changed to 1.8f. If the input sampling rate remains unchanged for the rate converter, the input sampling rate of 2f is now out of phase with the poly-phase filter coefficients. Therefore, for the rate converter of FIG. 7 the input sampling rate and the output sampling rate are completely flexible. The performance is limited generally by the number of filter coefficients used, that is for example, the number of coefficients used to perform the 2 to 6 to 3 in our example would likely be totally insufficient to handle the 44.1 to 7068 to 48 audio rate conversion.

Figure 8A:
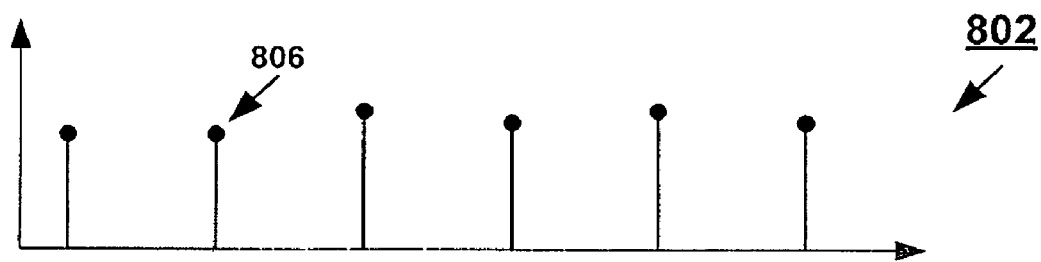
FIGS. 8A and 8B illustrate the derivation of the phase offset q.
Figure 8B:
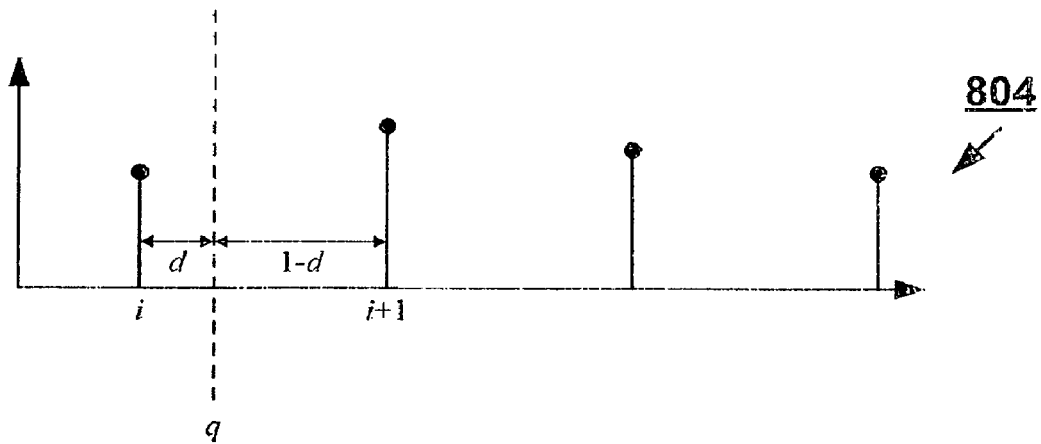

FIGS. 8A and 8B illustrate the derivation of the phase offset q. Graph 802 shows samples at the input sampling rates. Graph 804 shows the filter samples for which are determined at the nominal input sampling rate. For example, returning to the examples of FIGS. 2A-2D, the poly-phase rate converter may store $h_i[1]$ as h[3], h[5], h[4]; and $h_i[0]$ as {h[0],h[2], h[1]}. In this example, the nominal input sampling rate of graph 804 is 2f. However, if the input sampling rate is then changed to 2.2f; the input samples no longer align to appropriate filter coefficients. In FIGS. 8A and 8B, sample 806 falls at q which is between filter samples at i and i+1. The fractional portion is indicated by d. It should be noted that the samples used here are merely to delineate the timing and the scale is not necessarily representative of real samples.

Figure 9A:
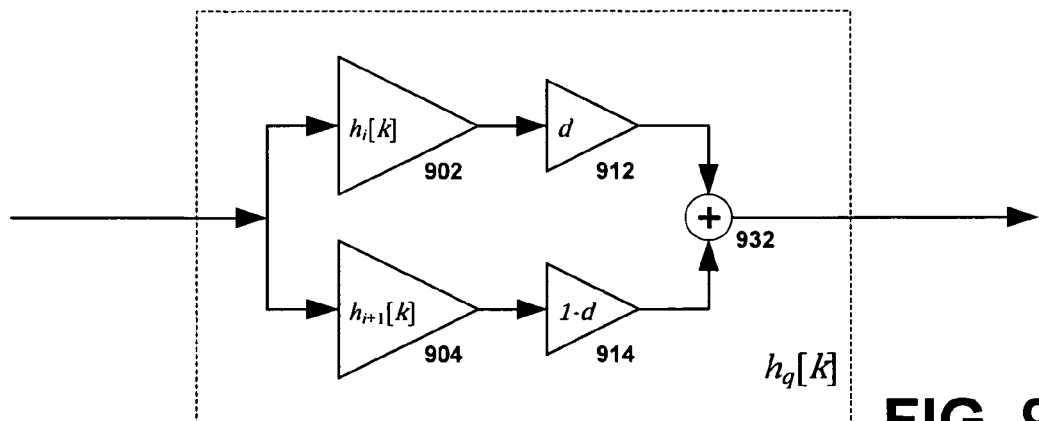
FIG. 9A illustrates deriving $h_q[k]$ using linear interpolation between the two nearest $h_i[k]$'s.

Embodiments of the present invention use interpolation based on stored coefficients $h_i[k]$, which offer a fast method for deriving the $h_q[k]$'s. FIG. 9A illustrates deriving $h_q[k]$ using linear interpolation between the two nearest $h_i[k]$'s. Since q falls between i and i+1, scaling element 902 and 904 apply filter coefficients $h_i[k]$, and $h_{i+1}[k]$, respectively to the common input and are complementarily scaled by scaling elements 912 and 914 according to the proximity of q to i and i+1, respectively, that is by d and 1−d. The results are combined by adder 934. The approximation can be summed up mathematically as $$h_q[k]=(1-d)h_i[k]+dh_{i+1}[k]. \quad (8)$$

Figure 9B:
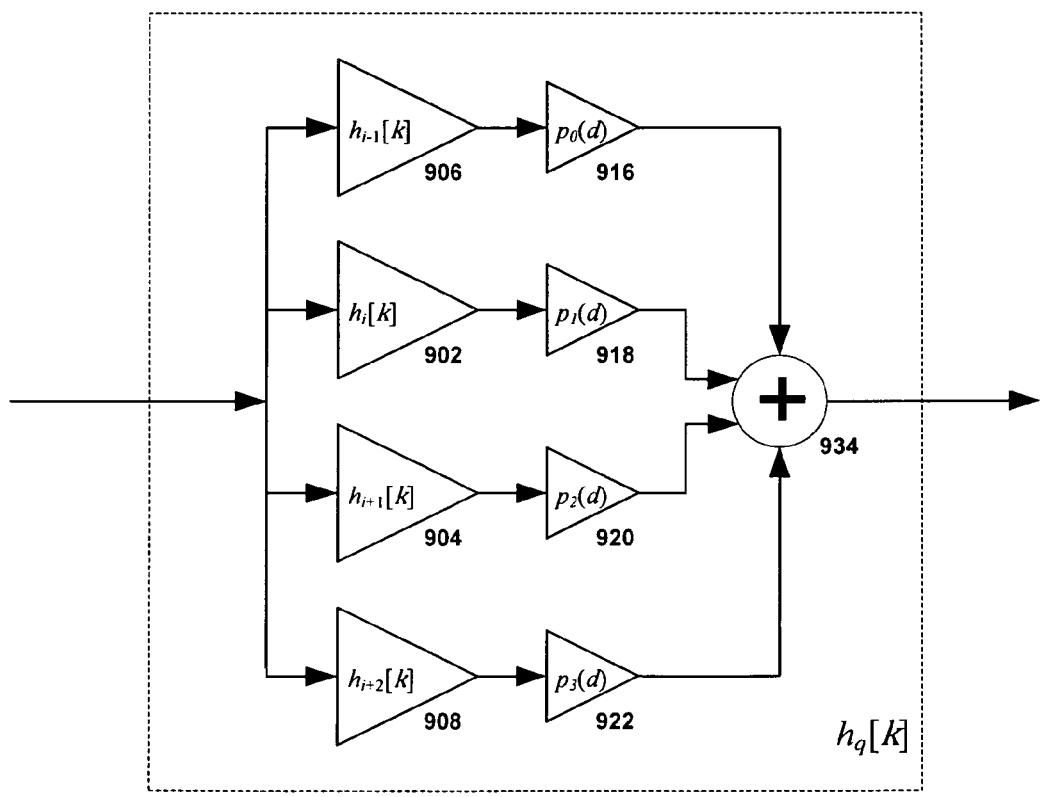
FIG. 9B illustrates deriving $h_q[k]$ using cubic interpolation between the four nearest $h_i[k]$'s.

FIG. 9B illustrates deriving $h_q[k]$ using cubic interpolation between the four nearest $h_i[k]$'s. Since q falls between i and i+1, scaling element 902 and 904 apply filter coefficients $h_i[k]$, and $h_{i+1}[k]$. Additionally, scaling elements 906 and 908 apply filter coefficients filter coefficients $h_{i-1}[k]$, and $h_{i+2}[k]$. Scaling elements 916, 918, 920, and 922, apply scale factors $p_0(d)$, $p_1(d)$, $p_2(d)$ and $p_3(d)$, respectively. to $h_{i-1}[k]$, $h_i[k]$, $h_{i+1}[k]$ and $h_{i+2}[k]$, in accordance to a cubic interpolation. The results are combined by adder 934 The approximation can be summed up mathematically as $$h_q[k]=p_0(d)h_{i-1}[k]+p_1(d)h_i[k]+p_2(d)h_{i+1}[k]+p_3(d)h_{i+2}[k]. \quad (9)$$

It should be noted that there are various forms of cubic interpolation including spline cubic and hermite cubic. Also, other interpolation techniques known in the art can also be used to approximate $h_q[k]$. It is a tradeoff between accuracy of interpolation and computational efficiency.

Figure 10:
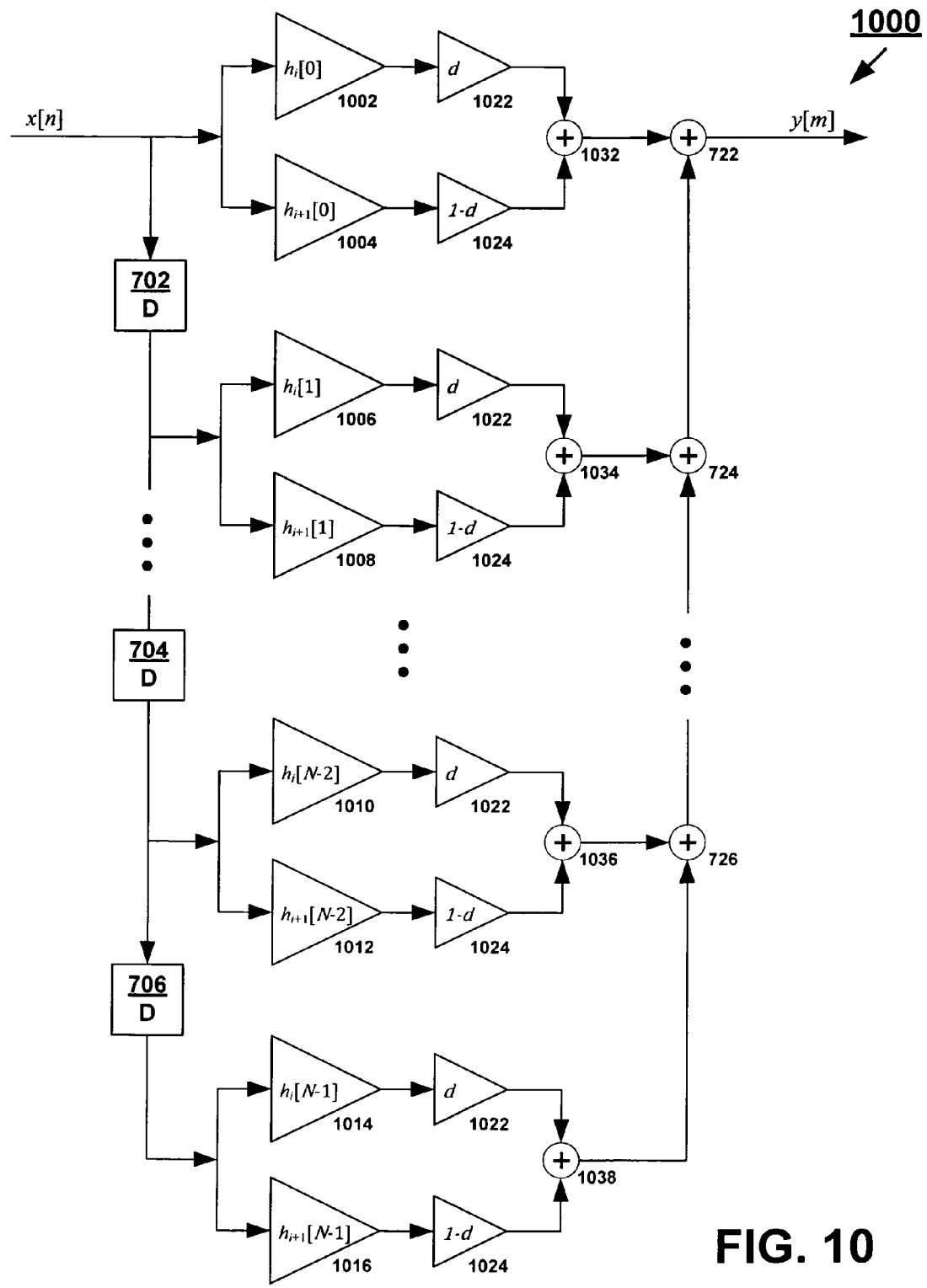
FIG. 10 illustrates a rate converter employing the linear interpolation of FIG. 9A.

FIG. 10 illustrates a rate converter employing the linear interpolation of FIG. 9A. Rate converter 1000 is like rate converter 700 with a plurality of delay elements and one or more adders operating similarly to their counterparts in rate converter 700. Scaling elements 712, 714, 716, and 718 are replaced by the interpolation module shown in FIG. 9A. The first module comprises scaling elements 1002, 1004, 1022, and 1024 which operate in a similar fashion as described for scaling elements 902, 904, 912 and 914. Likewise, scaling elements 1006, 1008, 1010, 1012, 1014, and 1016 in the second, third and fourth module shown operate similarly to their counterparts 902 and 904 in FIG. 9A. Adders 1032, 1034, 1036 and 1038 operate similarly to adder 922.

Figure 11:
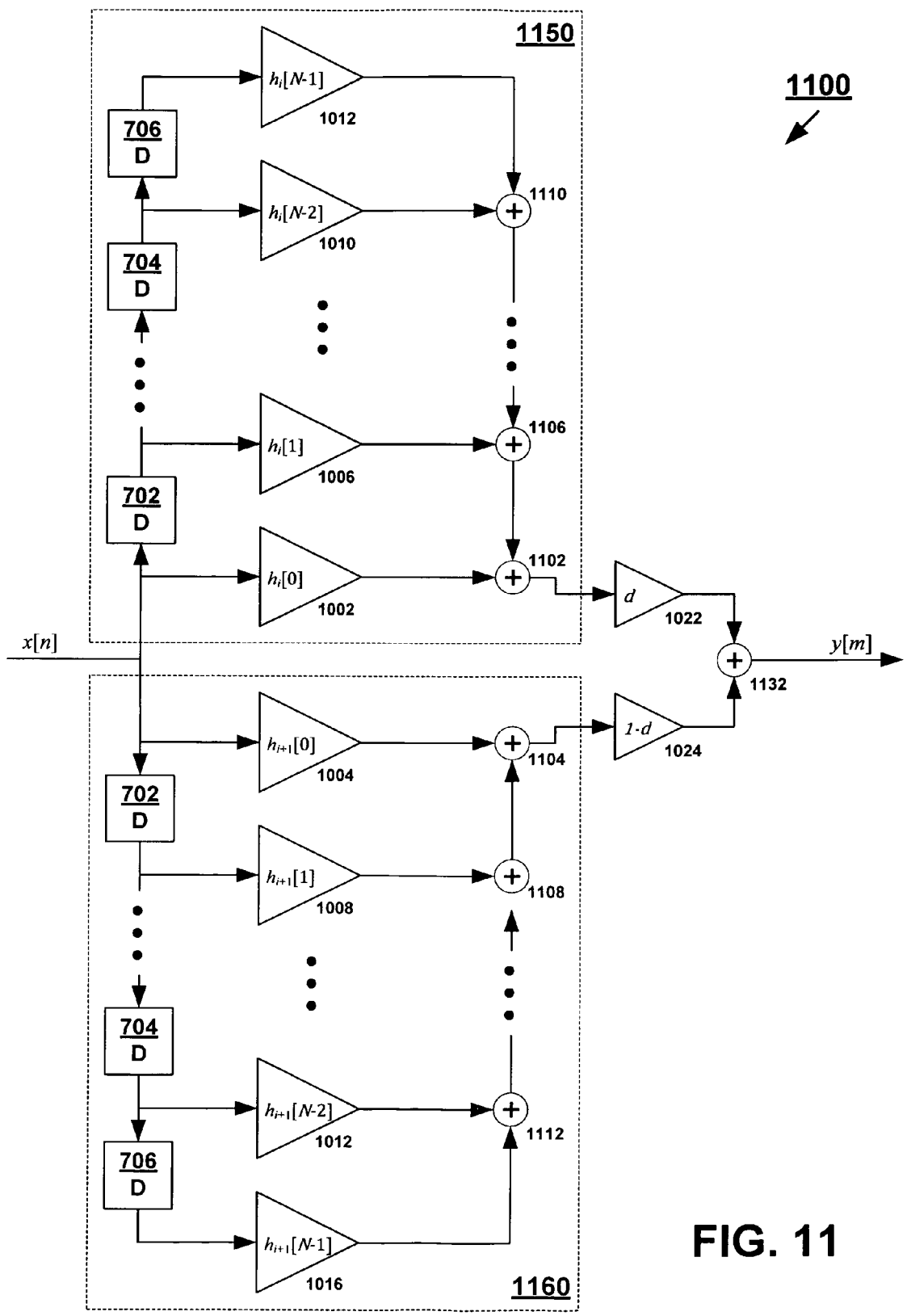
FIG. 11 shows an alternate architecture for a rate converter employing linear interpolation.

FIG. 11 shows an alternate architecture for a rate converter employing linear interpolation. Because each interpolation module in FIG. 10 comprises the same scale factors for the various instances of scaling element 1022 and 1024, respectively. They can be factored out, after the summation represented by adders 722, 724 and 726 of FIG. 10. Scaling elements 1002, 1004, 1006, 1008, 1010, 1012, 1014, and 1016 function similarly to that described in FIG. 10. The various instances of scaling elements 1022 and 1024 have been eliminated in favor of one instance of each after the summation shown by adders 1102, 1104, 1106, 1108, 1110, and 1112. Under this arrangement, it can be seen the components shown inside 1150 correspond to an instance of rate converter 500 from FIG. 5 at index i and the components shown inside 1160 correspond to an instance of rate converter 500 at index i+1.

Figure 12:
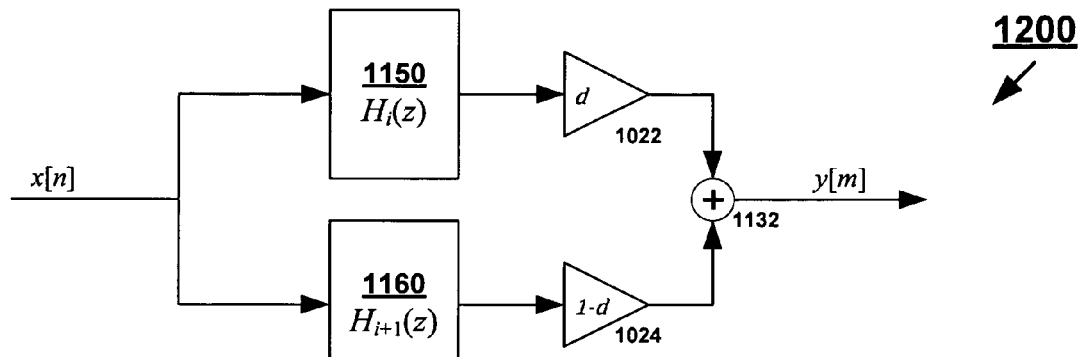
FIG. 12 shows a rate converter 1100 but in block diagram at the filter level.

FIG. 12 shows a rate converter 1200 but in block diagram at the filter level. Filter 1150 is a single phase of the poly-phase implementation of a rate converter at index i, and filter 1160 is single phase of the poly-phase implementation of a rate converter at index i+1. For the sake of simplifying notation, each phase at a given index j, of the poly-phase filter is given by the transfer function $H_j(z)$. This is particularly useful in a software implementation of a poly-phase rate converter because the same code could be re-used to calculate $H_i(z)$ and $H_{i+1}(z)$. The same principle applies to other interpolation methods such as the cubic interpolation.

Figure 13:
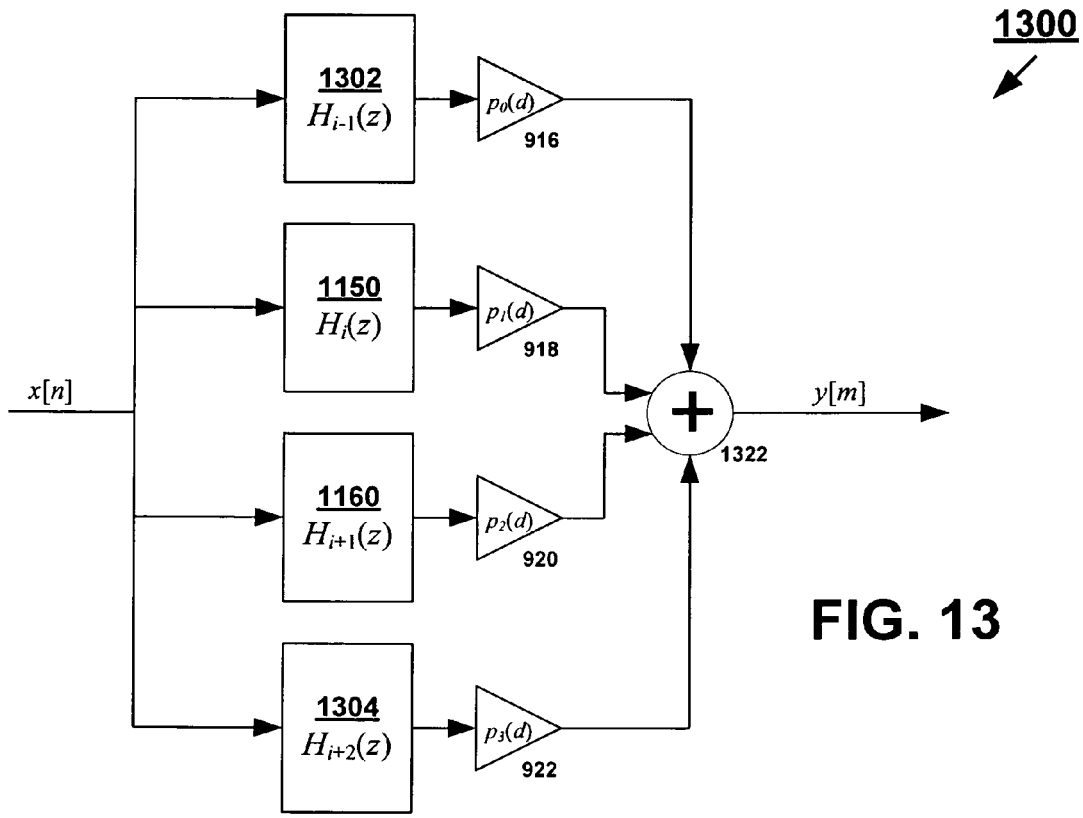
FIG. 13 shows a rate converter using cubic interpolation.

FIG. 13 shows a rate converter using cubic interpolation. In addition to blocks 1150 and 1160, blocks 1302 and 1304 using the transfer functions $H_{i-1}(z)$ and $H_{i+2}(z)$, respectively. Scaling elements 916, 918, 920 and 922 operate similarly to that described in FIG. 9B. The interpolation is completed by combiner 1322.

Figure 14A:
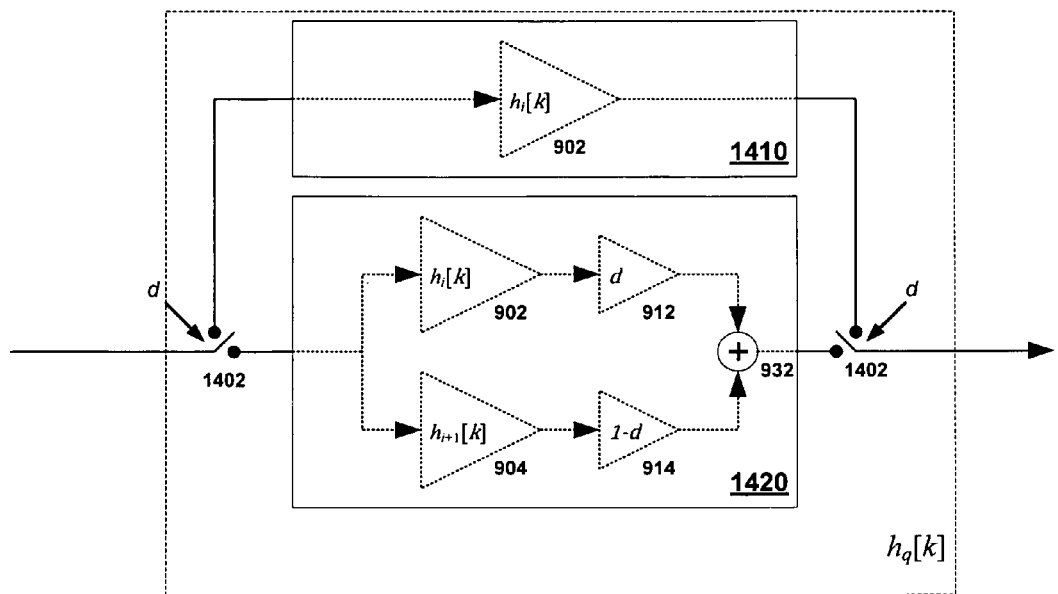
FIG. 14A shows an interpolation for $h_q[k]$ where if d is small only the scale factor of $h_i[k]$.

One drawback of the interpolation technique is that the number of multiplications and additions is at least doubled for linear interpolation and quadrupled for cubic interpolation. If the fractional portion is close to 0, then the contribution of the $dh_{i+1}[n]$ term in equation (8) is small and can be neglected. FIG. 14A shows an interpolation for $h_q[n]$ where if d is small only the scale factor of $h_i[k]$ is applied by scaling element 902. Functionally this is controlled by selector 1402, which selects between using functional block 1410 which scales the input by $h_i[k]$ or functional block 1420 which uses a linear approximation for $h_q[k]$, based on the value of d. Selector 1402 chooses which functional block should execute. In the case of a software implementation, selector 1402 chooses between two functions, one which uses linear interpolation, or one which uses the approximation $h_q[n] \approx h_i[n]$, is used instead. In this fashion, resources are saved by not executing the unselected alternative, in particular the interpolation. Mathematically, equation (8) becomes $$h_q[k] = \begin{cases} h_i[k], & d < T_1 \\ (1-d)h_i[k] + dh_{i+1}[k], & d \geq T_1, \end{cases} \quad (10)$$

where $T_1$ is a threshold used for determining whether d is small.

Figure 14B:
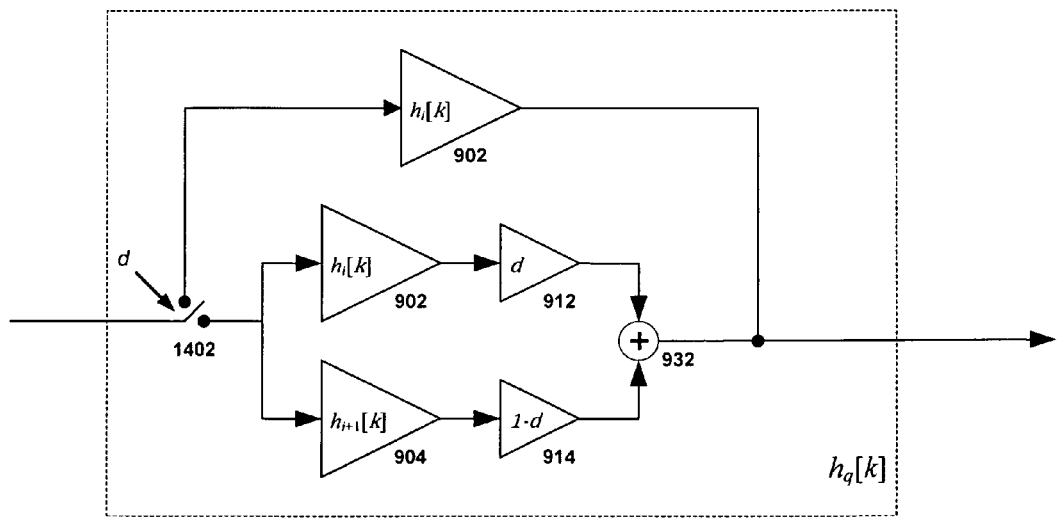
FIG. 14B shows the same diagram as in FIG. 14A except that the notation is simplified.

Because the diagram shown in FIG. 14A is somewhat cumbersome, FIG. 14B shows the same diagram as in FIG. 14A except that the notation is simplified. Even though it appears that two function blocks exist simultaneously, this is not intended to be a physical implementation. As explained above, for practical purposes, typically only one alternative functional block is performed at a time. Also it should be noted that scaling element 902 appears twice in the diagram, in actuality either hardware or as a software functional block, scaling element 902 could be the same scaling element be it hardware or code. Therefore in this and subsequent figure, it should be understood that alternate functional blocks are selected by the selector in each figure.

Figure 15:
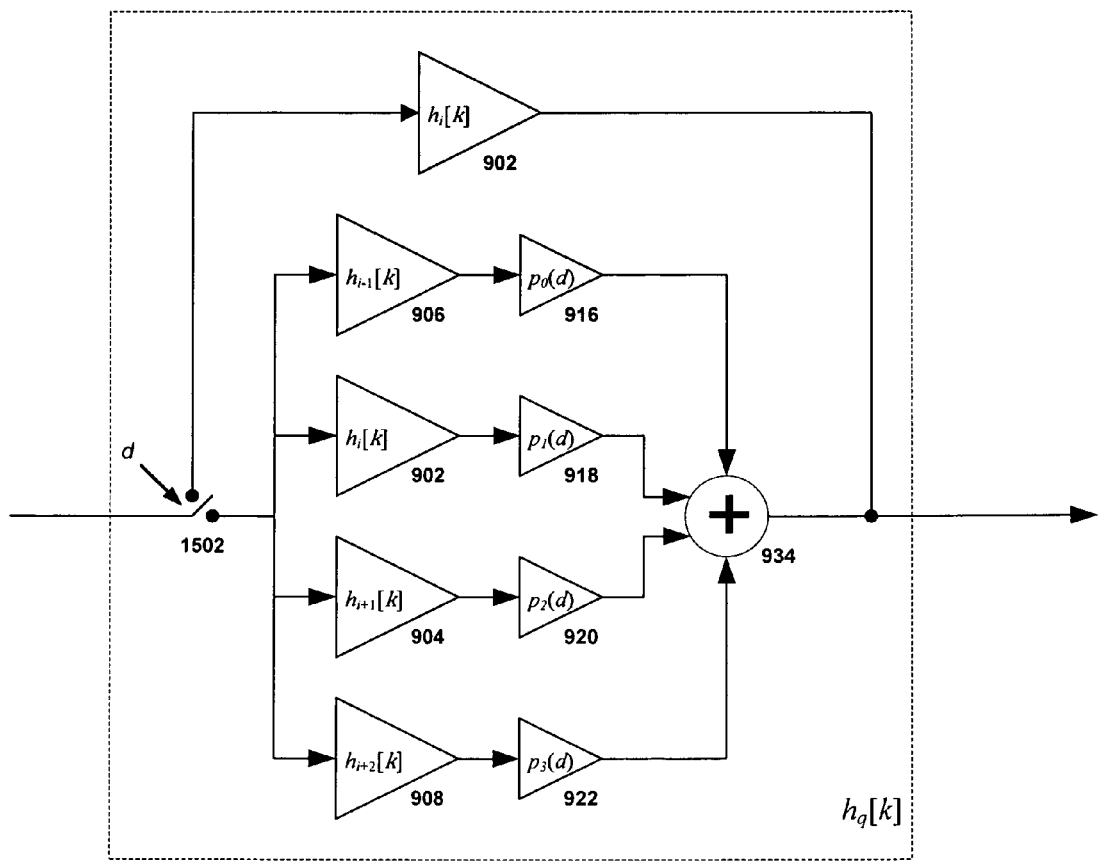
FIG. 15 shows a similar approximation to FIGS. 14A and 14B, but when cubic interpolation is used for $h_q[k]$.

Likewise, FIG. 15 shows a similar approximation when cubic interpolation is used. When d is small then the following approximations can be made to the interpolation of equation (9), $p_0(d) \approx 0$, $p_1(d) \approx 1$, $p_2(d) \approx 0$ and $p_3(d) \approx 0$. This is controlled in FIG. 15 by the addition of selector 1502 which selects between $h_i[k]$ and a cubic approximation for $h_q[k]$.

Figure 16:
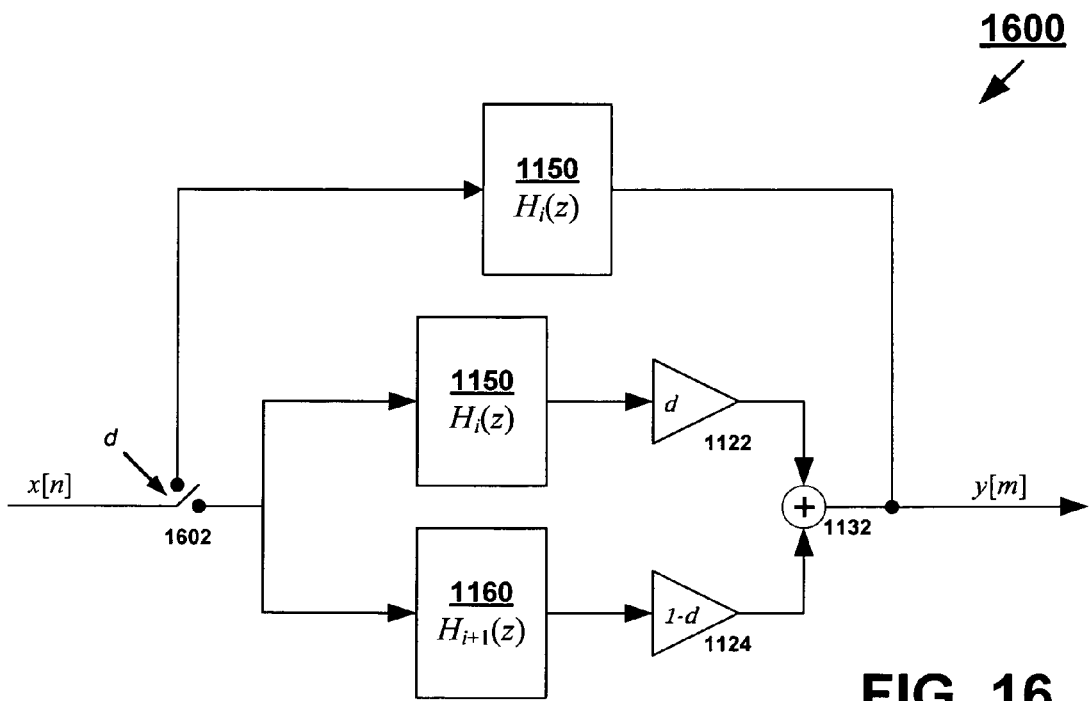
FIG. 16 shows a rate converter selectively employing linear interpolation.
Figure 17:
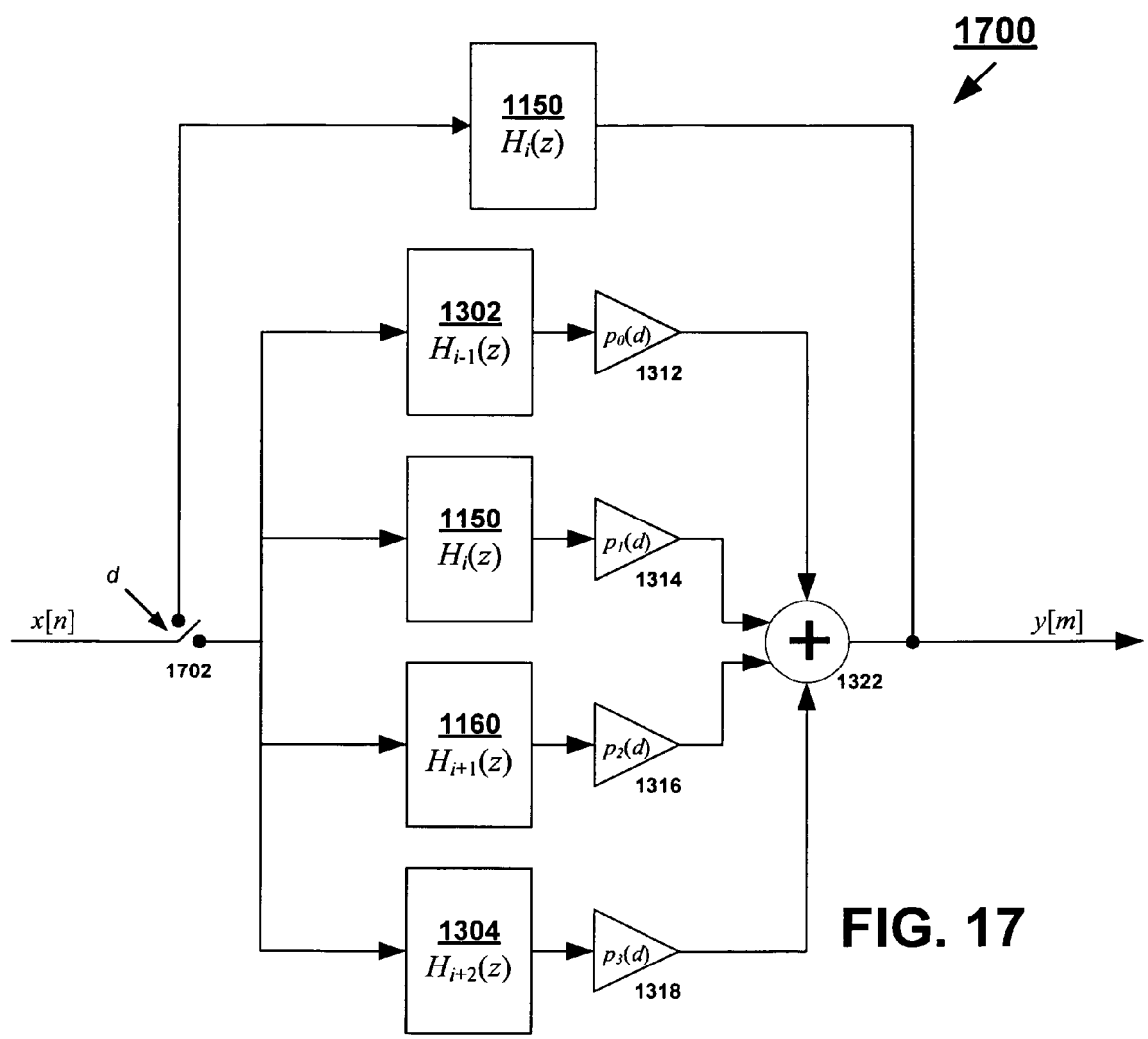
FIG. 17 shows a rate converter selectively employing cubic interpolation.

Rather than interpolate or approximate each $h_q[k]$, a selection can be made between an interpolation based on the $H_j(z)$ for nearby j's or to use $H_i(z)$ if d is small. FIG. 16 shows a rate converter selectively employing linear interpolation. Rate converter 1600 essentially selects between rate converter 1200 of FIG. 12 or conventional poly-phase rate converter 500 of FIG. 5 depending on whether the fractional value is close to zero. When d is small, the filter $H_i(z)$ is used. Otherwise, the output is a linear combination of the output of filters $H_i(z)$ and $H_{i+1}(z)$. This selection is shown functionally as performed by selector 1602. FIG. 17 shows a rate converter selectively employing cubic interpolation. Rate converter 1700 essentially selects between rate converter 1300 of FIG. 13 or conventional poly-phase rate converter 500 of FIG. 5 depending on whether the fractional value is small. When d is small, the filter $H_i(z)$ is used. Otherwise, the output is a cubic interpolated the output of filters $H_{i-1}(z)$, $H_i(z)$, $H_{i+1}(z)$ and $H_{i+2}(z)$. This selection is shown functionally as performed by selector 1702.

Figure 18:
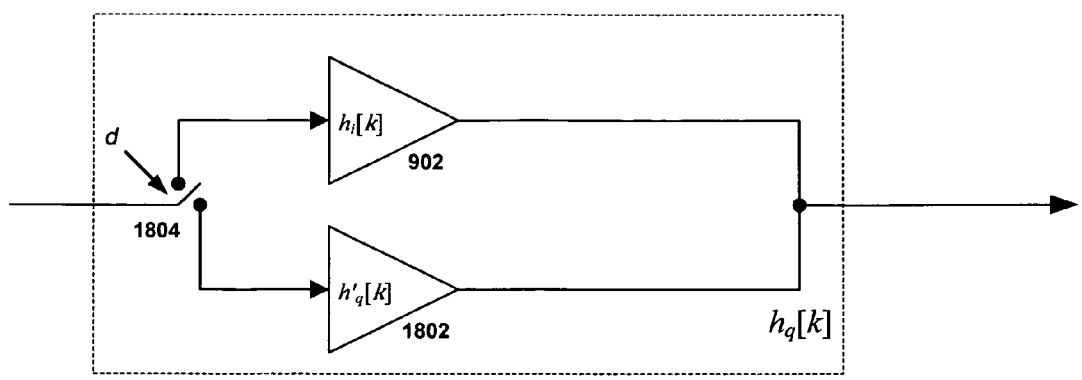
FIG. 18 shows an example of using an approximation for small fractional parts in a block diagram.

In general, any interpolation technique can be used. For notational simplicity, $h'_q[k]$ represents an approximation of $h_q[k]$ obtained through interpolation of [k] for indices j near q and $H'_q(z)$ represents the filter structures derived from those approximations. FIG. 18 shows an example of using an approximation for small fractional parts in a block diagram. Here $h_q[k]$ is approximated by $h_i[k]$ when d is small and otherwise by $h'_q[k]$, shown as interpolated scaling element 1802. The selection is shown functionally as performed by selector 1804. If the linear interpolation of FIG. 9A is used to derive $h'_q[k]$, then rate converter 1800 is essentially rate converter 1400. If the cubic interpolation of FIG. 9B is used to derive $h'_q[k]$, then rate converter 1800 is essentially rate converter 1500.

Figure 19:
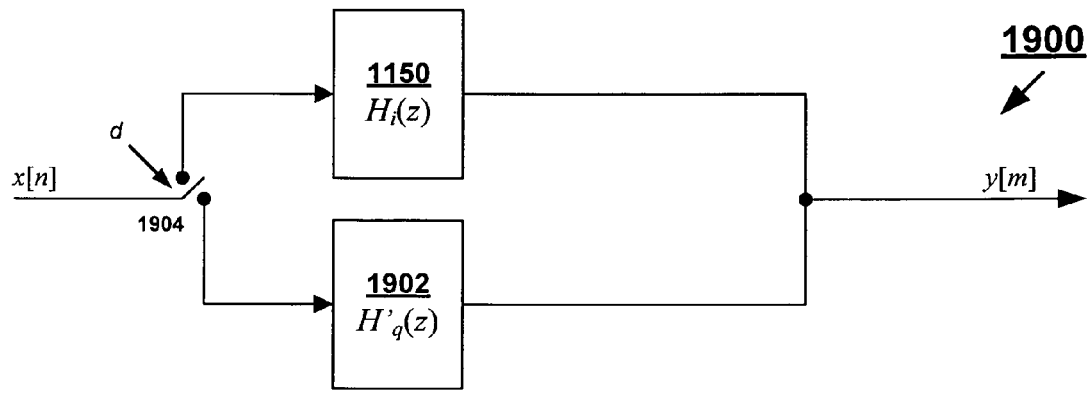
FIG. 19 shows an example of using an approximation for small fractional parts at the filter level.

FIG. 19 shows an example of using an approximation for small fractional parts at the filter level. Rate converter 1900 essentially functions as filter 1150 when d is small and functions filter 1902 otherwise, where filter 1902 is a filter structure derived from interpolation approximations. For example, if the filter structure of rate converter 1200 using linear interpolation is used for $H'_q(z)$, then rate converter 1900 is essentially rate converter 1600. If the filter structure of rate converter 1300, using cubic interpolation is used for $H'_q(z)$, then rate converter 1900 is essentially rate converter 1700.

Figure 20:
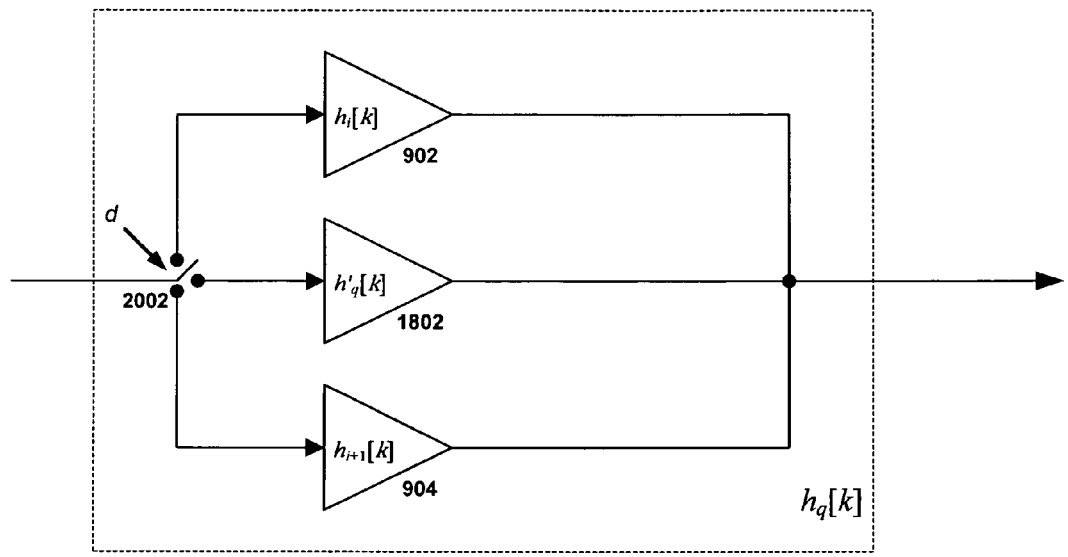
FIG. 20 shows another scaling element for scaling by an approximation to $h_q[k]$
Figure 21:
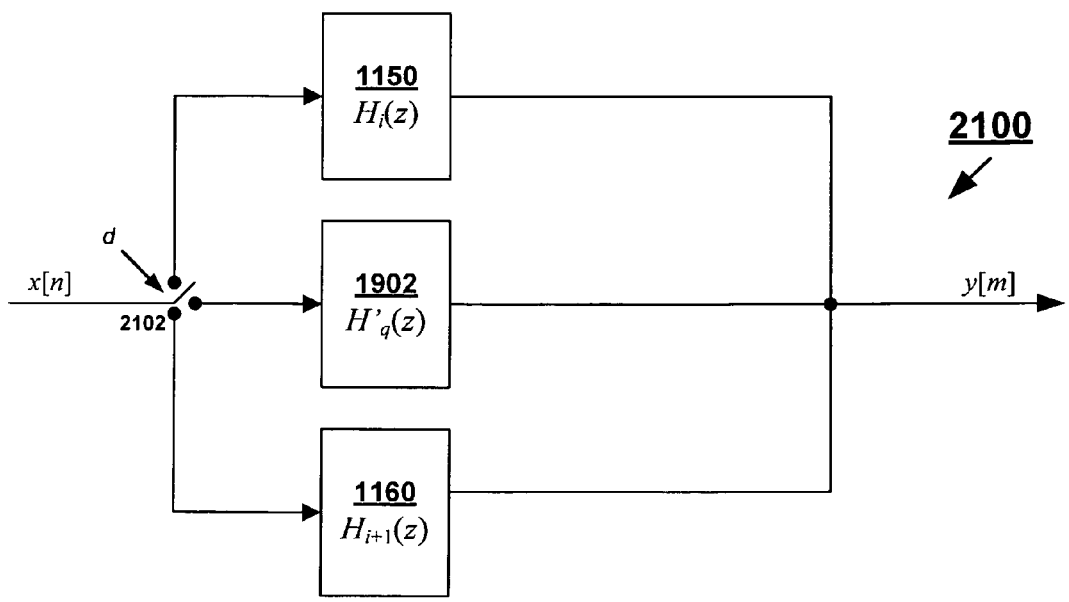
FIG. 21 shows another rate converter.

FIG. 20 shows another scaling element for scaling by an approximation to $h_q[k]$. The scaling element comprises interpolated scaling element 1802 similar to that described for FIG. 18. Much like in FIG. 18, when d is small, selector 2002 selects scaling element 902 to apply $h_i[k]$ to the input. In addition when d≈1, selector 2002 selects scaling element 904 to apply $h_i[k]$ to the input. Otherwise, selector 2002 uses interpolated scaling element 1802. Mathematically, this architecture can be described as $$h_q[k] = \begin{cases} h_i[k], & d < T_1 \\ h_{i+1}[k], & d > T_2 \\ h'_q[k], & \text{otherwise,} \end{cases} \quad (11)$$

where $T_2$ is a threshold used to determine the closeness of d to 1. Similarly, FIG. 21 shows another rate converter. Rate converter 2100 comprises selector 2102 which selects filter 1150 when d is small, filter 1160 when d is close to 1 and filter 1902 which uses a filter structure employing interpolation, otherwise.

Figure 22:
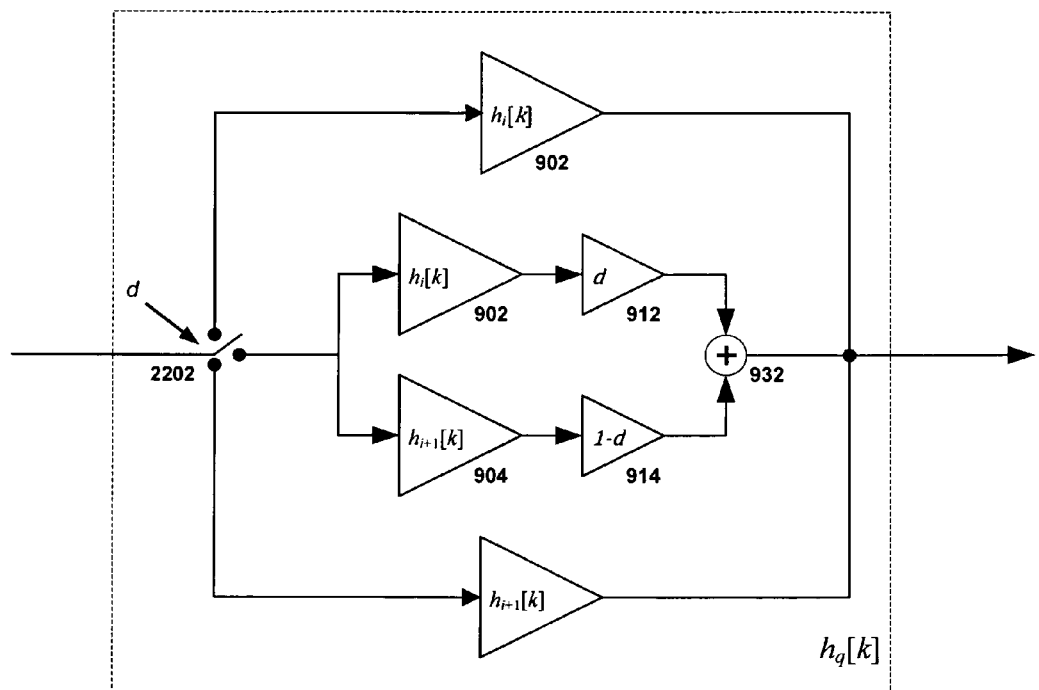
FIG. 22 shows a scaling element for scaling by an approximation to $h_q[k]$, when the linear interpolated scaling element of FIG. 9A is used.
Figure 23:
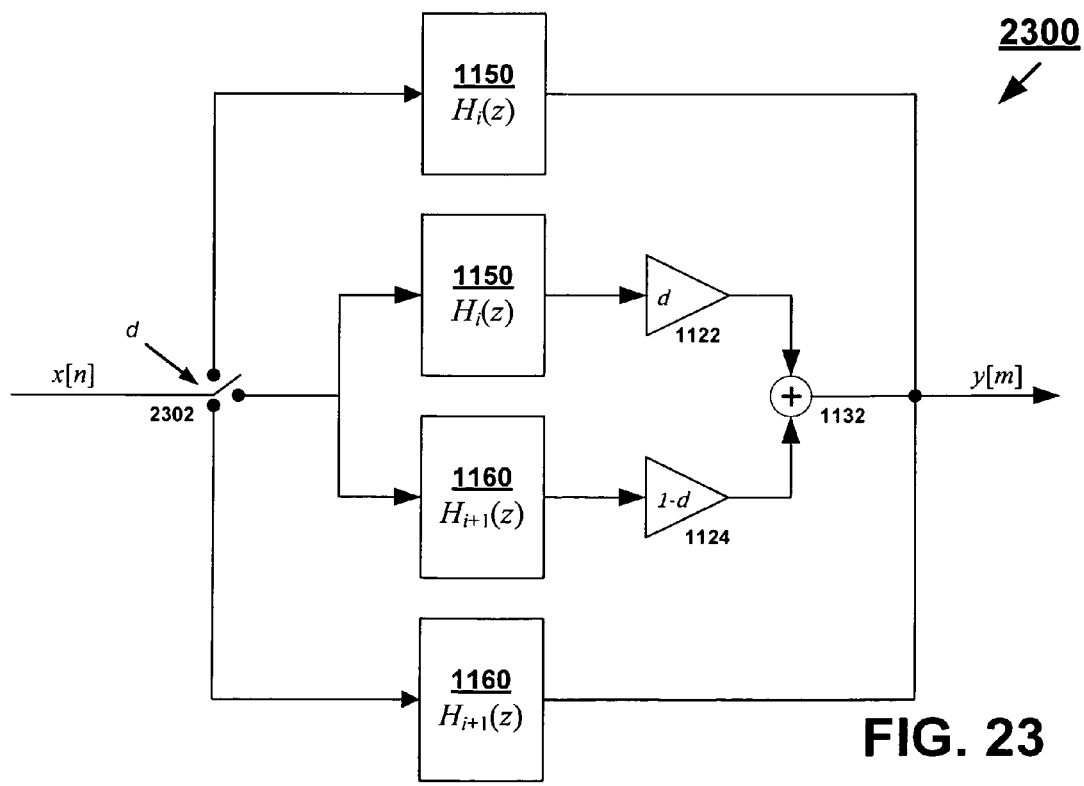
FIG. 23 shows an implementation of rate converter 2100 when the linear interpolated filter structure of rate converter 1200 is used.
Figure 24:
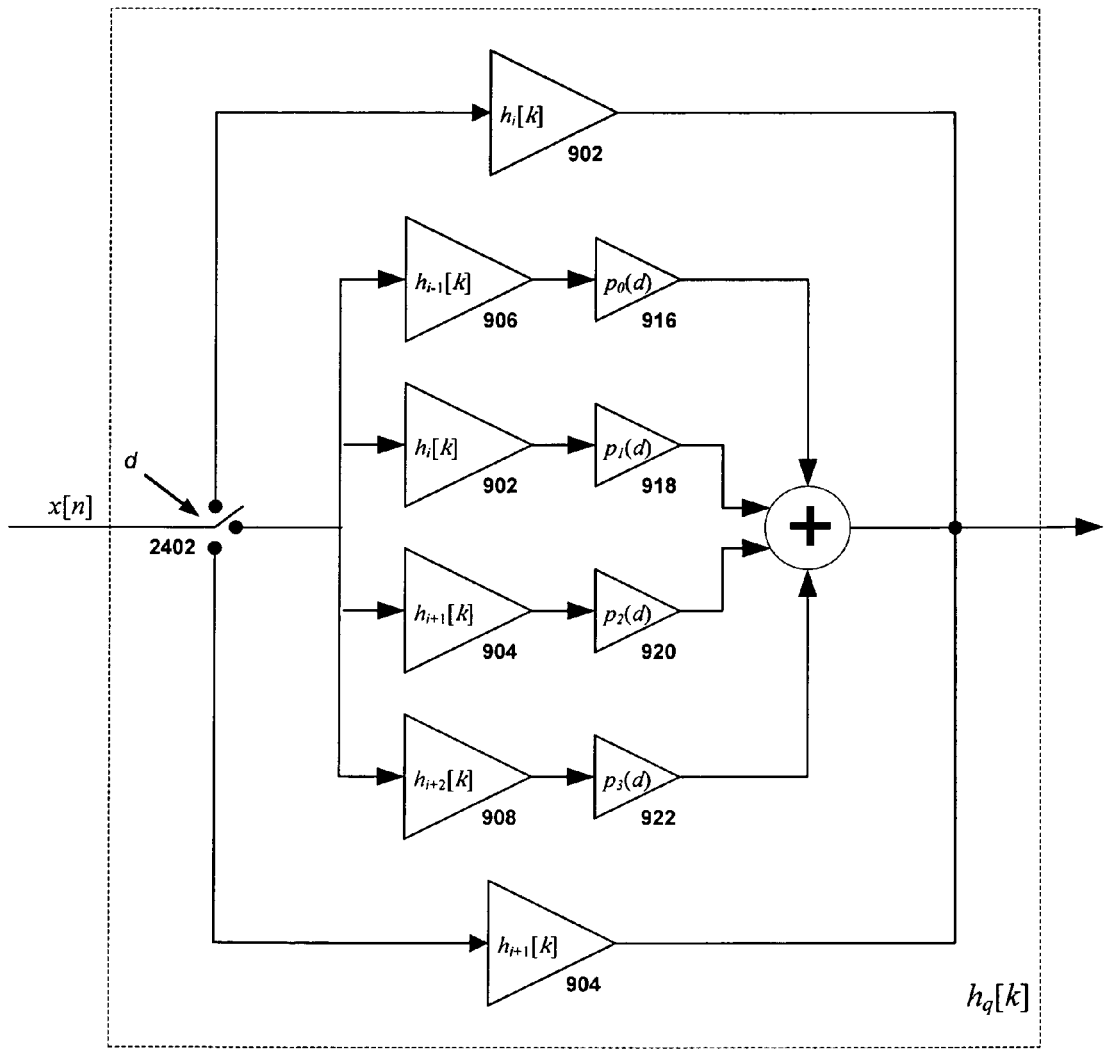
FIG. 24 shows a scaling element for scaling by an approximation to $h_q[k]$, when the cubic interpolated scaling element of FIG. 9B is used.
Figure 25:
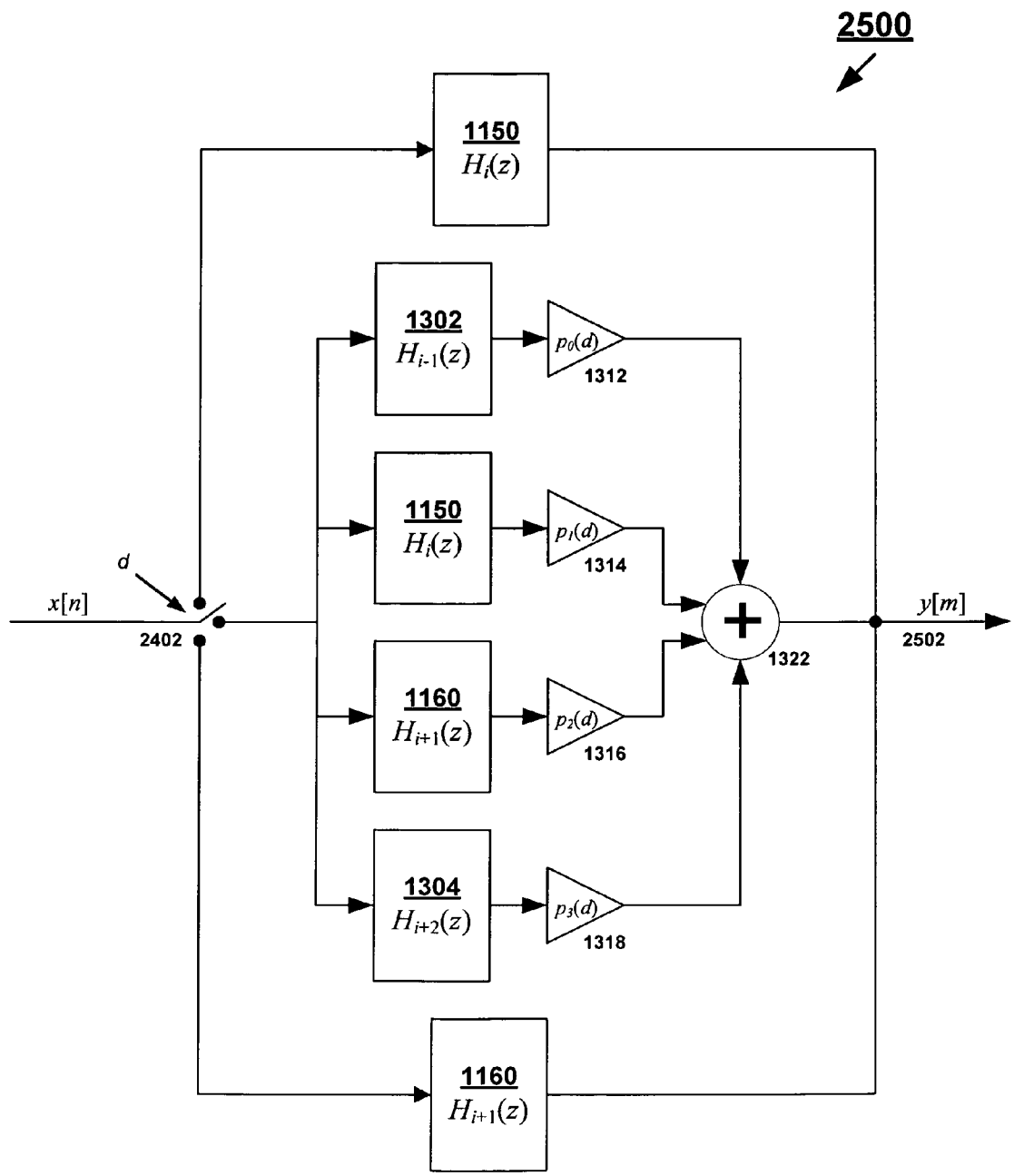
FIG. 25 shows an implementation of rate converter 2100 when the cubic interpolated filter structure of rate converter 1300 is used.

FIG. 22 shows a scaling element for scaling by an approximation to $h_q[k]$, when the linear interpolated scaling element of FIG. 9A is used. FIG. 23 shows an implementation of rate converter 2100 when the linear interpolated filter structure of rate converter 1200 is used. FIG. 24 shows a scaling element for scaling by an approximation to $h_q[k]$, when the cubic interpolated scaling element of FIG. 9B is used. FIG. 25 shows an implementation of rate converter 2100 when the cubic interpolated filter structure of rate converter 1300 is used.

When the input sampling rate is higher than the output sampling rate, the input samples flow into a delay line and may move down more than one delay element before an output is generated. For example, if the input sampling rate is twice the output sampling rate. Input samples flow down two delay elements for every output period when the output samples are calculated. This results in unnecessary processing of the delay lines every input sample period when processing the delay line every output sample period is all that is needed. Therefore, in order to receive the input samples, but not to advance them in a delay line until they are needed. Multiple delay lines can be used.

Figure 26:
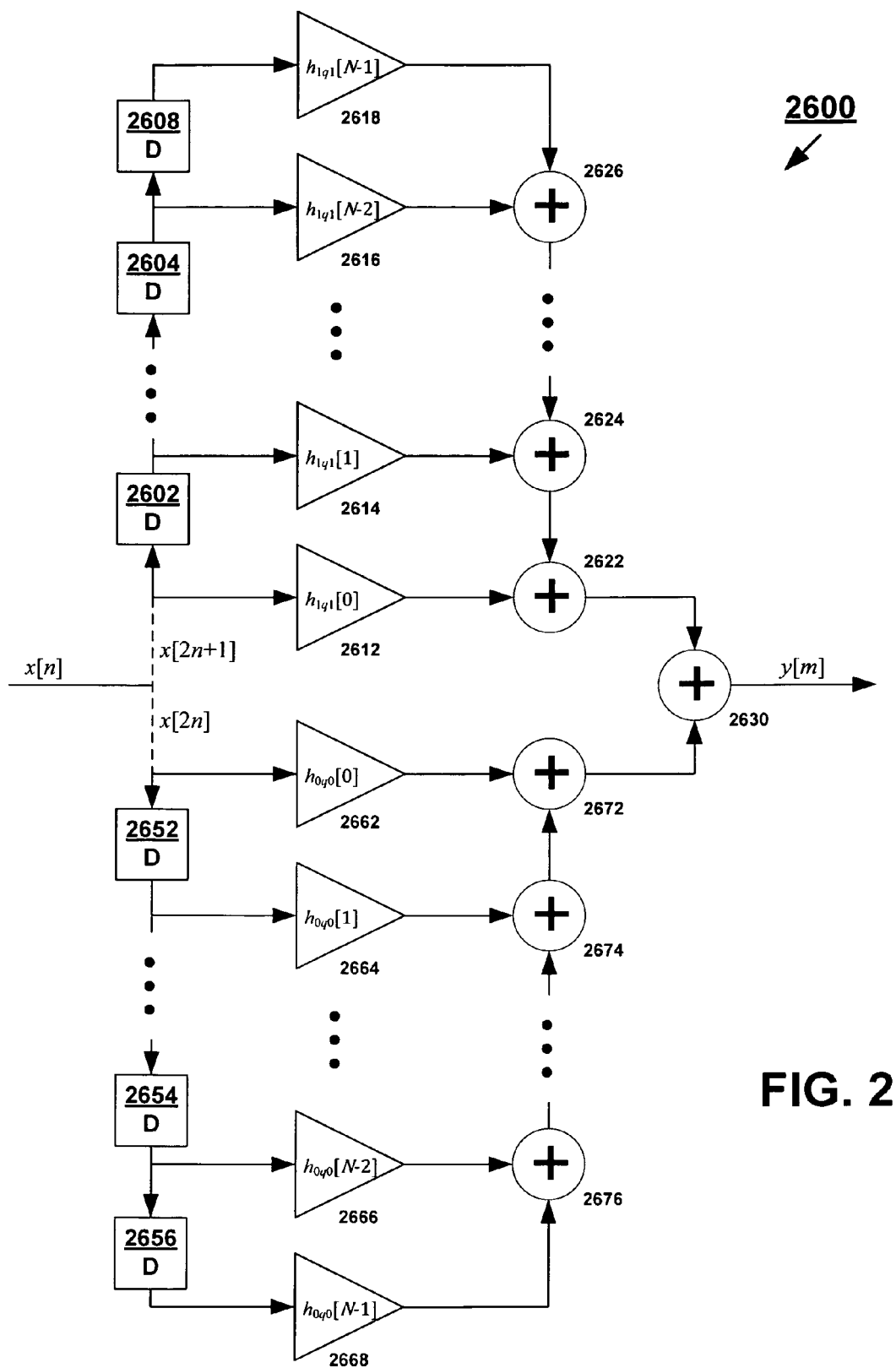
FIG. 26 shows a poly-phase rate converter where multiple delay lines are used.

FIG. 26 shows a poly-phase rate converter where multiple delay lines are used. By mathematically rearranging the operations in a rate converter such as rate converter 700 in FIG. 7, rate converter 2600 can be derived. Approximately, the same number of delay elements, scaling elements and adders are used. The number may not be exact for example, if the original rate converter had an odd number of delay elements and rate converter 2600 had uses two delay lines. There also may be additional elements required for overhead such as adder 2630. In addition the poly-phase coefficients are shuffled. Additionally, the separation into poly-phase subfilters can lead to additional optimization. For example, it is not uncommon that for certain rate conversions that $h_{kq_k}[n]$ is 1 for a given value of n say $n_0$ and zero for all other values of n. The zeroes in the filter coefficients make the design of the kth subfilter much simpler, and the delay line does not need to extend beyond the $n_0$ element.

As a result, delay elements 2602, 2604, and 2606, scaling elements 2612, 2614, 2616, and 2618, and adders 2622, 2624, and 2626, form essentially one poly-phase filter and delay elements 2652, 2654, and 2656, scaling elements 2662, 2664, 2666 and 2668 and adders 2672, 2674 and 2676, form essentially another poly-phase filter. The outputs are combined by adder 2630. Mathematically rate converter 2600 and rate converter 700 are the same provided that they share the same parameters, (i.e., size and coefficients). However, in this arrangement, the two delay lines operate at the slower output sampling rate. In this fashion, the rate converter 2600 has been factored into two poly-phase subfilters. It should be noted that the multiplication by the scaling elements are now indexed differently each scaling element is now represented by $h_{kq_k}[n]$, where k k represents the kth subfilter. The second "index" $q_k$ is similar to the "index" q in FIG. 7 except it may be different than the for each subfilter hence they are indexed by k. They may differ because each poly-phase subfilter is represents a different phase with respect to the slower output sampling rate. Though only two subfilters are shown, clearly, this architecture can be generalized to arbitrary multiple delay lines and subfilters.

Figure 27:
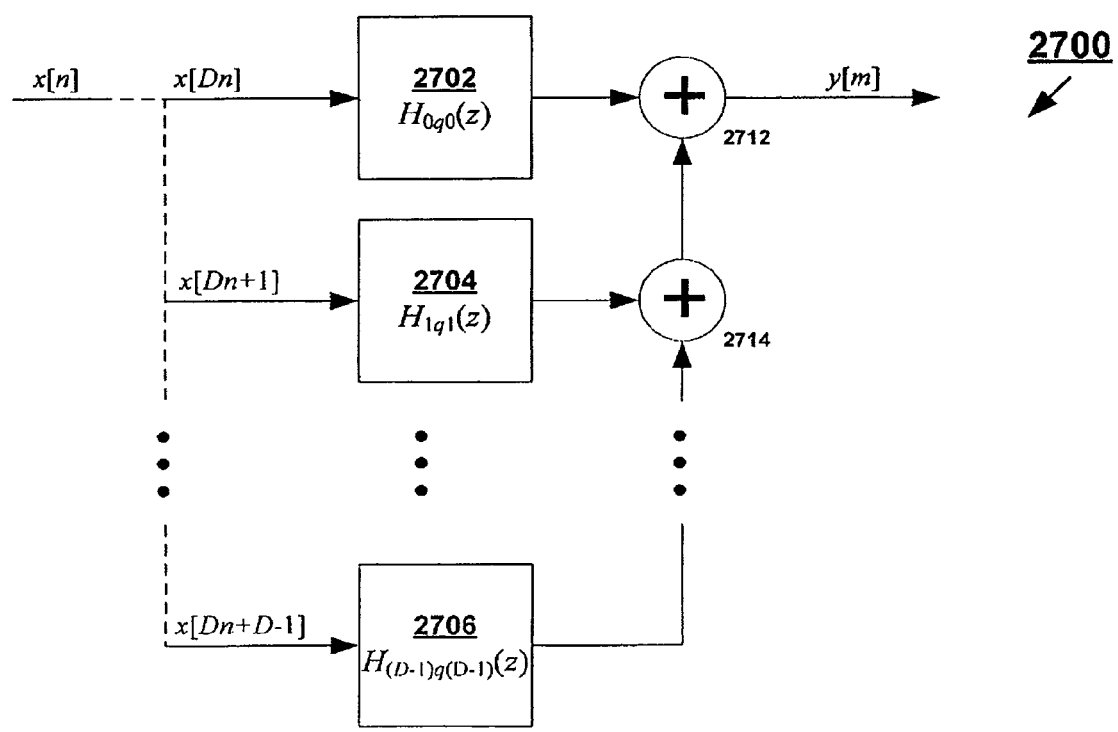
FIG. 27 shows a rate converter employing D poly-phase subfilters.

FIG. 27 shows a rate converter employing D poly-phase subfilters. In particular it shows a particular instance of the rate converter. When the input sample x[n] is received it actually goes into only one of the poly-phase subfilters, but at this time the "index" is adjusted in all the subfilters to the appropriately determined $q_k$. Hence at that instance each subfilter is represented by the notation $H_{kq_k}$ where k indexes all the subfilters, here ranging from 0 to D−1. Depicted in FIG. 27 are representative subfilters, where subfilter 2702 is notated by $H_{0q_0}$, subfilter 2704 is notated by $H_{1q_1}$ and subfilter 2706 is notated by $H_{(D-1)q_{(D-1)}}$. The results of all subfilters are summed up by one or more adders represented here by adders 2712 and 2714.

Each subfilter can be approximated by using interpolation and the approximation techniques described above. For example, each subfilter can employ scaling elements such as shown in FIGS. 14B, 15, 18, 20, 22 and 24. Or the interpolation and approximation can be factored outside each subfilter such as shown in FIGS. 16, 17, 19, 21, 23 and 25.

Figure 28:
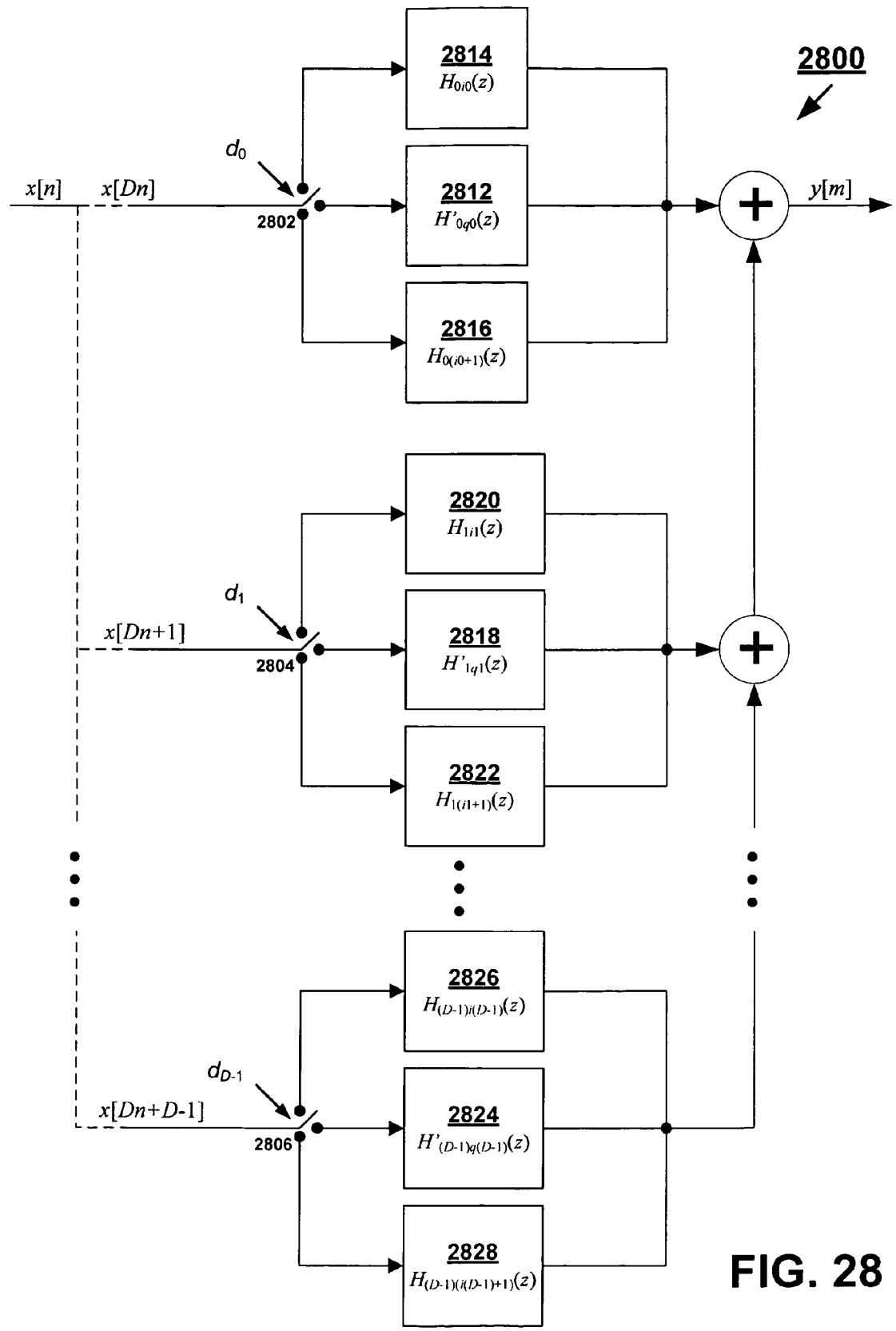
In FIG. 28, each subfilter uses the approximation structure of FIG. 21.

FIG. 28 shows an approximation using both interpolation and approximation techniques when q is close to an integer. In FIG. 28, each subfilter uses the approximation structure of FIG. 21. In particular, $H'_{kq_k}(z)$, represented by subfilters 2812, 2818, and 2824 is an approximation of $H_{kq_k}(z)$ using any one of the interpolation techniques described above. For each subfilter, an index $i_k$ and fractional part $d_k$ is determined from $q_k$. If $d_k$ is near zero then the subfilter $H_{ki_k}(z)$, represented by subfilters 2814, 2820 and 2826, is applied. If $d_k$ is near one then the subfilter $H_{k(i_k+1)}(z)$, represented by subfilters 2816, 2822 and 2828. For each approximation a selector, represented in FIG. 28 by selectors 2802, 2804 and 2806, can be used to select which calculation or subfilter to apply.

Figure 29:
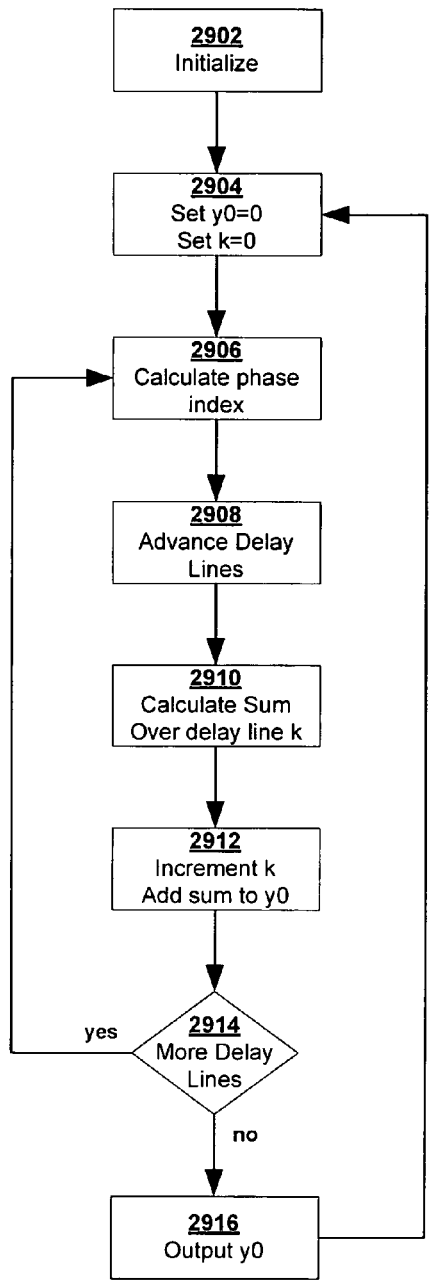
FIG. 29 shows a flow chart of an implementation of a traditional rate converter using multiple poly-phase subfilters.

FIG. 29 shows a flow chart of an implementation of a traditional rate converter using multiple poly-phase subfilters. At step 2902, the system is initialized. At step 2904, an output accumulator $y_o$ is initialized to zero as is k which indexes the subfilters which sets the current subfilter to the kth subfilter. At step 2906, the phase index i for the current subfilter is determined. For a traditional rate converter $q_k$ for each subfilter will fall on an integer. At step 2908, the delay lines are advanced if necessary. The advancement of the delay line in each subfilter is advanced at the appropriate time. The advancement can be based on the time when a new output sample is calculated or can be based on when an input sample is received. For example, the first input sample goes into the delay line of the first subfilter and that delay line is advanced. The second input sample goes into the delay line of the second subfilter and so forth. When all the input samples needed to calculate the next output sample are available, the next output sample is calculated. Another method makes use of an input buffer. Input samples are buffered for example in a first-in first-out (FIFO) buffer. Each time an output sample is ready to be computed (i.e., one output sample period) the necessary input samples are read from the FIFO and entered into the delay lines of the subfilters. For example, if the input sample rate is three times the output sample rate and there are three subfilters. Every sample period, three samples are read from the FIFO and entered into each delay line for the three subfilters. In this way, input samples need only be accessed every time an output value needs to be generated. During each advancement step, each subfilters delay line may receive zero, one or many input samples depending on the input and output sampling rates. When upsampling, it is even possible that for a given output sample, no delay lines are advanced. Therefore, each subfilter receives input samples if available. If one or more samples are available the delay lines are advanced (i.e. oldest samples are discarded and newly received samples are added).

At step 2910, the sum $$\sum_{j=0}^{c-1} h_i[j]x_k[n-j],$$

where $$x_k[n]=x[Dn+k]$$

$h_i$ are the filter coefficients for the current subfilter, and C is the number of filter coefficients for the subfilter, is calculated. At step 2912, the sum is added to $y_0$ and k is incremented. At step 2914, a determination is made as to whether all subfilters have been applied (i.e., k=D). If not, the process returns to step 2908 and repeats until all subfilters have been applied. If so, the value of $y_0$ is output as the current output sample at step 2916 and the process returns to step 2904 for the next output sample.

Figure 30:
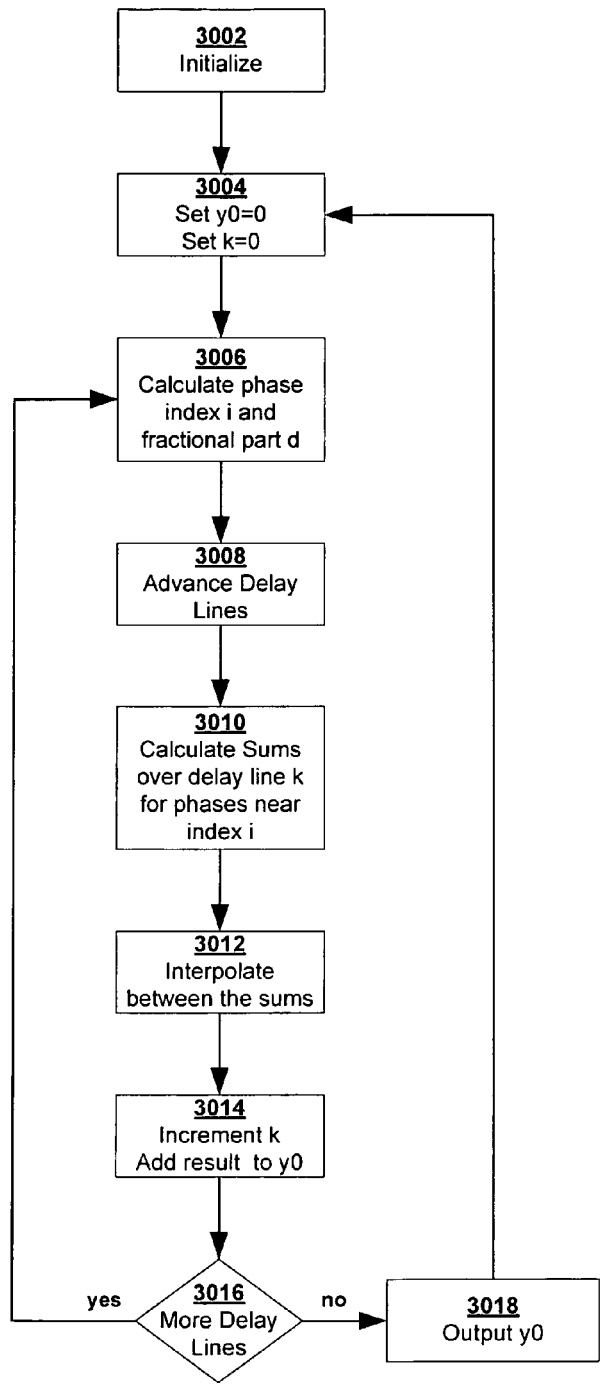
FIG. 30 a flow chart of an implementation of a rate converter using multiple poly-phase subfilters using interpolation.

FIG. 30 a flow chart of an implementation of a rate converter using multiple poly-phase subfilters using interpolation. At step 3002, the system initialized. At step 3004, an output accumulator $y_0$ is initialized to zero as is k which indexes the subfilters which sets the current subfilter to the kth subfilter. At step 3006, the phase offset q the phase index i and fractional part d for the current subfilter is determined. At step 3008, the delay line in each subfilter is appropriately advanced as describe above for step 2908. At step 3010, the sums $$\sum_{j=0}^{c-1} h_l[j]x_k[n-j],$$

are calculated for values of l near q. The number of sums calculated is dictated by the type of interpolation algorithm used. For linear only the two nearest values to q, i and i+1 are used. For cubic interpolation the nearest four values are required. At step 3012, an interpolation between sums is performed. In the case of linear interpolation, the result of the interpolation looks like:

$$(1-d)\sum_{j=0}^{c-1} h_i[j]x_k[n-j] + d\sum_{j=0}^{c-1} h_{i+1}[j]x_k[n-j].$$

In the case of cubic interpolation, the result of the interpolation looks like:

$$p_0(d)\sum_{j=0}^{c-1} h_{i-1}[j]x_k[n-j] + p_1(d)\sum_{j=0}^{c-1} h_i[j]x_k[n-j] +$$

$$p_2(d)\sum_{j=0}^{c-1} h_{i+1}[j]x_k[n-j] + p_3(d)\sum_{j=0}^{c-1} h_{i+2}[j]x_k[n-j].$$

At step 3014, the result is added to $y_0$ and k is incremented. At step 3016, a determination is made as to whether all subfilters have been applied. If not, the process returns to step 3008 and repeats until all subfilters have been applied. If so, the value of $y_0$ is output as the current output sample at step 3018 and the process returns to step 3004 for the next output sample.

Figure 31:
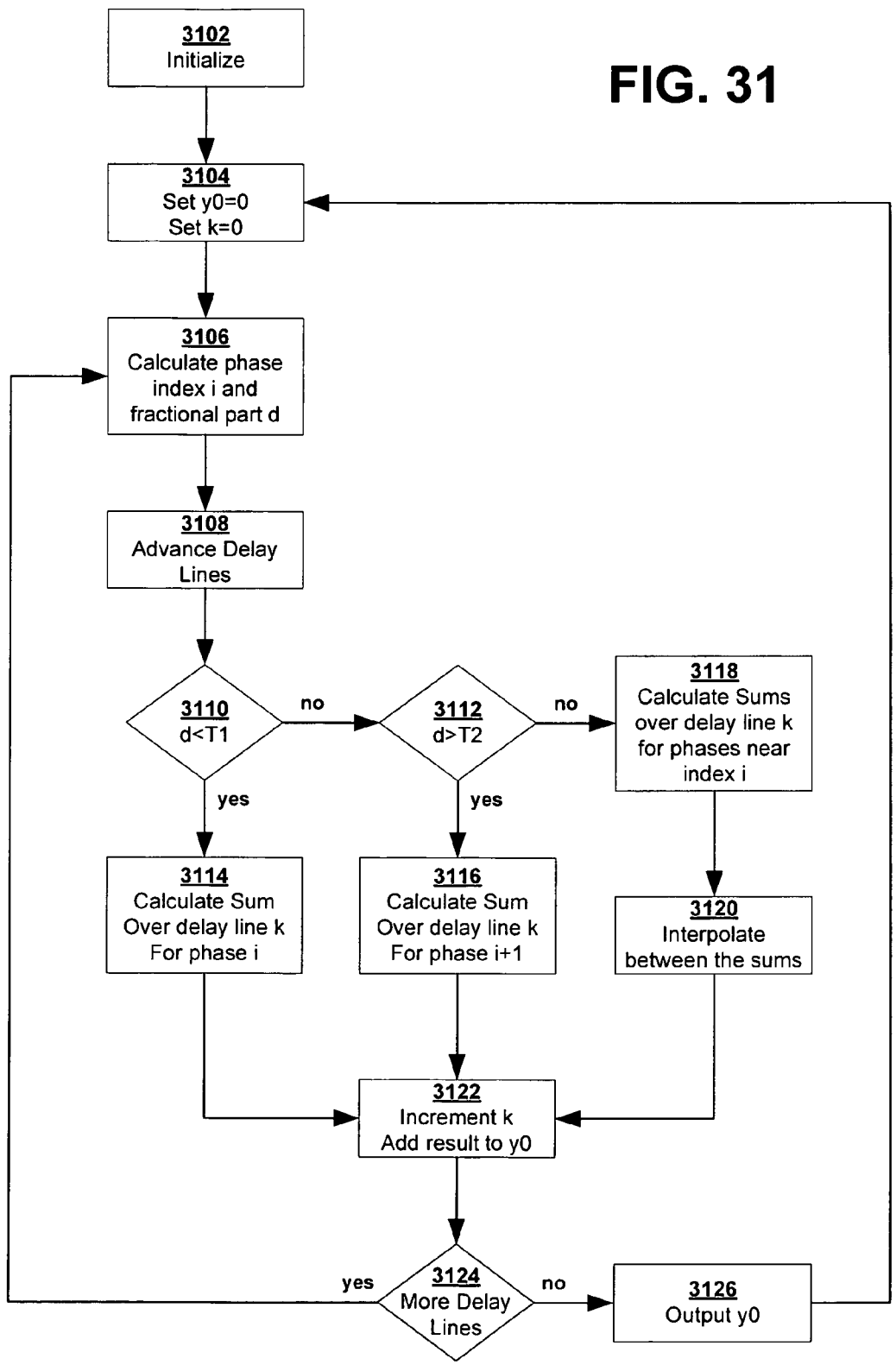
FIG. 31 a flow chart of an implementation of a rate converter using multiple poly-phase subfilters using interpolation and small fraction approximation.

FIG. 31 a flow chart of an implementation of a rate converter using multiple poly-phase subfilters using interpolation and small fraction approximation. At step 3102, the system initialized. At step 3104, an output accumulator $y_0$ is initialized to zero as is k which indexes the subfilters which sets the current subfilter to the kth subfilter. At step 3106, the phase offset q the phase index i and fractional part d for the kth subfilter is determined. At step 3108, the delay line in each subfilter is appropriately advanced as describe above for step 2908.

At step 3110, a determination is made as to whether d is closed to zero (i.e., $d<T_1$) If so, the sum $$\sum_{j=0}^{c-1} h_i[j]x_k[n-j]$$

is calculated at step 3114. If not, at step 3112 a determination is made as to whether d is closed to one (i.e., $d>T_2$, it should also be noted that if symmetry is important $T_2$ could be set equal to $1-T_1$.) If so, the sum $$\sum_{j=0}^{c-1} h_{i+1}[j]x_k[n-j]$$

is calculated at step 3116, otherwise the, sums $$\sum_{j=0}^{c-1} h_l[j]x_k[n-j],$$

are calculated for values of l near q at step 3118. Again, the number of sums calculated is dictated by the type of interpolation algorithm used. For linear only the two nearest values to q, i and i+1 are used. For cubic interpolation the nearest four values are required. At step 3120, an interpolation between sums is performed. In the case of linear interpolation, the result of the interpolation looks like:

$$(1-d)\sum_{j=0}^{c-1} h_i[j]x_k[n-j] + d\sum_{j=0}^{c-1} h_{i+1}[j]x_k[n-j].$$

In the case of cubic interpolation, the result of the interpolation looks like:

$$p_0(d)\sum_{j=0}^{c-1} h_{i-1}[j]x_k[n-j] + p_1(d)\sum_{j=0}^{c-1} h_i[j]x_k[n-j] +$$

$$p_2(d)\sum_{j=0}^{c-1} h_{i+1}[j]x_k[n-j] + p_3(d)\sum_{j=0}^{c-1} h_{i+2}[j]x_k[n-j].$$

At step 3122, the result of steps 3114, 3116 or 3020 is added to $y_0$ and k is incremented. In the case of linear interpolation used, the result look like $$\begin{cases} \sum_{j=0}^{c-1} h_i[j]x_k[n-j] & \text{if } d_k < T_1 \\ \sum_{j=0}^{c-1} h_{i+1}[j]x_k[n-j] & \text{if } d_k > T_2 \\ (1-d)\sum_{j=0}^{c-1} h_i[j]x_k[n-j] + d\sum_{j=0}^{c-1} h_{i+1}[j]x_k[n-j] & \text{if } T_1 \le d_k \le T_2. \end{cases}$$

At step 3124, a determination is made as to whether all subfilters have been applied. If not, the process returns to step 3108 and repeats until all subfilters have been applied. If so, the value of $y_0$ is output as the current output sample at step 3126 and the process returns to step 3104 for the next output sample.

The preceding flowcharts show how flexible rate converters using a single or multiple poly-phase filter architecture can be used to efficiently implemented in software. In particular the use of small fraction approximation can reduce the amount of calculations need to be performed.

In addition to adding flexibility to the sampling rates that can be accommodated by the above described rate converters. The ability to interpolate and approximate using the techniques above also allows for the trade-off between storing filter coefficients and interpolating them. For example, if $h_i[k]$ is not available due to memory constraints, $h_i[k]$ could, for instance, be approximated by interpolating between $h_{i-1}[k]$ and $h_{1+1}[k]$. Since in the example of 44.1 kHz to 48 kHz rate conversion 5000 to 10000 coefficients need to be stored, the number could be reduced in exchange for increased computation. This enables the filter designer to trade off between memory and computational complexity.

In addition to upsampling and downsampling, the flexible rate conversion architectures can be employed to for synchronization. The need for synchronization arises when the precise input sampling rate is no known. In the simplest example, the input sampling rate is expected to be approximately the same as the output sampling rate, but due to slight differences in hardware between the device supplying the input and the rate converter, the precise rate is not known and does not exactly match the output sampling rate. In a more generalized example, the rate converter expects the input at the nominal input sampling rate, but can be adjusted to determine the precise input sampling rate.

FIG. 32 illustrates a system for rate conversion which can determine the input sampling rate. Rate conversion system 3200 comprises first-in-first-out (FIFO) buffer 3202, flexible rate converter 3204 and controller 3206. Flexible rate converter 3204 can be any of the architectures described above for flexible rate conversion. In addition, the input sampling rate of flexible rate converter 3204 can be adjusted. Controller 3206 receives status information from FIFO buffer 3202. This status information comprises an indication of how full the FIFO. Nominally, the FIFO is half full, if the input sampling rate set for the rate converter is less than the actual input sampling rate, the FIFO will fill up. In this situation, controller 3206 will receive an indication that the FIFO is filling up or near full. Upon receiving the indication, controller 3206 increases the input sampling rate of the rate converter. Similarly, if the input sampling rate set for the rate converter is greater than the actual input sampling rate, the FIFO will drain. In this situation, controller 3206 will receive an indication that the FIFO is depleting or near empty. Upon receiving the indication, controller 3206 decreases the input sampling rate of the rate converter.

One method of determining the near full and near empty condition is to set thresholds within the FIFO. FIG. 33 is a diagram of a FIFO used in an embodiment of the rate conversion system depicted in FIG. 32. Nominally, FIFO 3300 operates at point 3302, the half empty point. If FIFO 3300 reaches point 3304 a near full indication is sent to the controller. If FIFO 3300 reaches point 3306 a near empty indication is sent to the controller.

Figure 34:
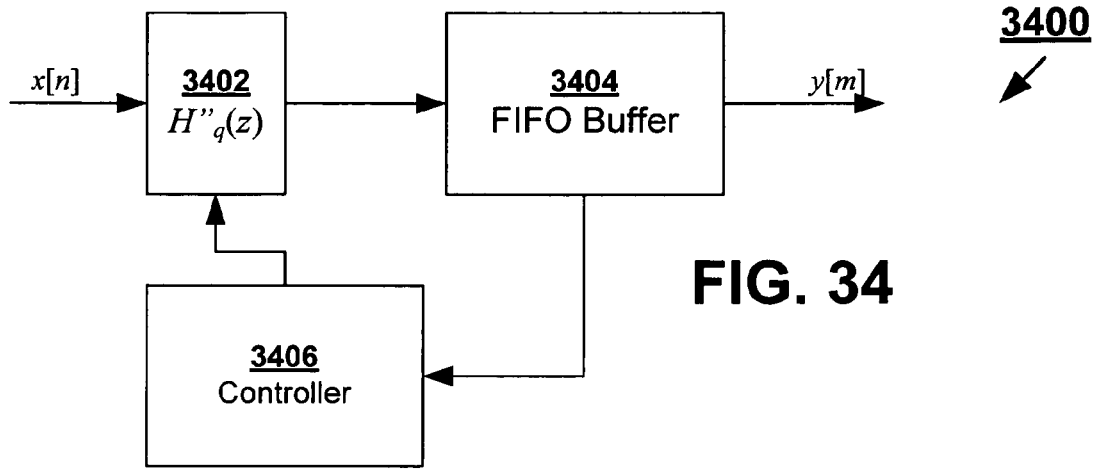
FIG. 34 illustrates a system for rate conversion which can determine the output sampling rate.

Because as described about, the flexible rate conversion systems described throughout can applied to adjustable output sampling rates as well as input sampling rates, a flexible rate conversion system can be used also to a synchronizing rate converter when the output rate is unknown. FIG. 34 illustrates a rate conversion system which can determine the output sampling rate. Rate conversion system 3400 first-in-first-out (FIFO) buffer 3404, flexible rate converter 3402 and controller 3406. Flexible rate converter 3402 can be any of the architectures described above for flexible rate conversion. In addition, the output sampling rate of flexible rate converter 3402 can be adjusted. Very much like the synchronization to an unknown input sampling rate, controller 3406 receives status information from FIFO buffer 3402. This status information comprises an indication of how full the FIFO. Nominally, the FIFO is half full, if the output sampling rate set for the rate converter is greater than the actual output sampling rate, the FIFO will fill up. In this situation, controller 3406 will receive an indication that the FIFO is filling up or near full. Upon receiving the indication, controller 3406 decrease the output sampling rate of the rate converter. Similarly, if the output sampling rate set for the rate converter is less than the actual output sampling rate, the FIFO will drain. In this situation, controller 3406 will receive an indication that the FIFO is depleting or near empty. Upon receiving the indication, controller 3406 increase the output sampling rate of the rate converter.

Both the input synchronization described in FIG. 32 and the output synchronization described in FIG. 34 could be combined into a synchronizing rate converter where neither the input sampling rate nor the output sampling rate are precisely known. Specifically, both an input FIFO and an output FIFO would indicate overflow or underflow conditions to a controller which would adjust the input sampling rate and the output sampling rate of the rate converter.

Finally, the technique for determining rates could be applied to other architectures for variable rate converters. FIG. 35 shows a variable rate conversion system using linear interpolation of the input signal. Rather than interpolating between phases in the poly-phase filter, the interpolation takes place between input samples. In general interpolation, especially linear interpolation, is not used for rate conversion due to unintended spectral effects. However, in this limited case, the linear interpolation is used to adjust for differences between the input sampling rate and the nominal input sampling rate of poly-phase rate converter 1150. If the poly-phase rate converter is expecting a sample at corresponding to x[q]

where q lies between n and n−1, then x[q] is approximated by (1−d)x[n]+dx[n−1] where d=q−n−1. The interpolation is performed by scaling elements 3502 and 3504 and adder 3506. Small fraction approximation could also be used here to reduce complexity so that x[q] x[n−1] when d≈0 and x[q]≈x[n] when d≈1. When interpolation is done on the input signal, it must be done with special care to avoid aliasing effects. This is particularly an issue when the interpolation at the input results in sampling rate reduction. In combination of the rate determining system described in FIGS. 32, 33, and/or 34 the variable rate converter 3500 can be used for synchronization of an unknown input signal.

It should be noted that for simplicity of language all indexing uses regular arithmetic terms. However, it should be noted that all arithmetic relating to the phase offset and phase indices are practically performed modulo P, where P is the number of phases. So for instance if i=P−1 then i+1=0. In practical terms to deal with the wraparound values, filter coefficients are often shifted duplicas such that $h_P[n]=h_0[n-1]$ and $h_{P+1}[n]=h_1[n-1]$.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

We claim:

1. A variable rate converter comprising:
   a poly-phase filter having a nominal input sampling rate, an output sampling rate and a plurality of phases, each phase corresponding to a phase index and comprising a plurality of filter coefficients based on the nominal input sampling rate and the output sampling rate; and
   an approximator configured to approximate the poly-phase filter at a phase offset derived from an input sample having a variable rate.

2. The variable rate converter of claim 1, wherein the approximator includes an interpolator.

3. The variable rate converter of claim 2, wherein the interpolator is a linear interpolator.

4. The variable rate converter of claim 2, wherein the interpolator is a cubic interpolator.

5. A variable rate converter comprising:
   a poly-phase filter having a nominal input sampling rate, and an output sampling rate and a plurality of subfilters, each subfilter comprising a plurality of phases, each phase corresponding to a phase index and comprising a plurality of filter coefficients based on the nominal input sampling rate and the output sampling rate; and
   means for approximating each poly-phase subfilter at phase offsets derived from an input sample having a variable rate.

6. The variable rate converter of claim 5, wherein the means for approximating comprises a means for interpolating between results produced by each poly-phase subfilter with phase indices near the phase offset.

7. The variable rate converter of claim 6, wherein the means for interpolating uses a linear interpolation.

8. The variable rate converter of claim 6, wherein the means for interpolating uses a cubic interpolation.

9. A variable rate conversion method comprising:
   applying a poly-phase filter to an input sample having a variable rate, the poly-phase filter having a nominal input sampling rate, and an output sampling rate and a plurality of subfilters, each subfilter comprising a plurality of phases, each phase corresponding to a phase index and comprising a plurality of filter coefficients based on the nominal input sampling rate and the output sampling rate; and
   approximating each poly-phase subfilter at phase offsets derived from an input sample having the variable rate.

10. The variable rate conversion method of claim 9, wherein the approximating comprises interpolating between results produced by each poly-phase subfilter with phase indices near the phase offset.

11. The variable rate conversion method of claim 10, wherein the interpolating uses a linear interpolation.

12. The variable rate conversion method of claim 10, wherein the interpolating uses a cubic interpolation.

* * * * *